(12) United States Patent
Knoedgen

(10) Patent No.: US 6,781,423 B1
(45) Date of Patent: Aug. 24, 2004

(54) HIGH-VOLTAGE INTERFACE AND DRIVER CONTROL CIRCUIT

(75) Inventor: Horst Knoedgen, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 10/614,660

(22) Filed: Jul. 7, 2003

(30) Foreign Application Priority Data

Jul. 4, 2003 (EP) .............................. 03368067

(51) Int. Cl.⁷ .................... H02H 7/122; H03B 1/00
(52) U.S. Cl. ................................ 327/110; 327/448
(58) Field of Search ................... 327/108–110, 112, 327/447, 448, 494, 508; 363/17, 56.02, 58, 97, 98

(56) References Cited

U.S. PATENT DOCUMENTS

| | | | |
|---|---|---|---|
| 5,373,435 A | * 12/1994 | Jayaraman et al. | 363/98 |
| 5,502,632 A | * 3/1996 | Warmerdam et al. | 363/98 |
| 5,666,280 A | * 9/1997 | Janaswamy et al. | 363/98 |
| RE36,480 E | 1/2000 | Bourgeois et al. | 327/427 |
| 6,151,233 A | 11/2000 | Kondo | 363/125 |
| 6,184,716 B1 | 2/2001 | Depetro et al. | 326/83 |
| 6,335,643 B1 | * 1/2002 | Ono | 327/108 |
| 6,407,593 B1 | * 6/2002 | Kawamoto et al. | 327/110 |
| 6,445,623 B1 | 9/2002 | Zhang et al. | 365/189.11 |
| 6,680,630 B1 | * 1/2004 | Hiyama | 327/110 |

FOREIGN PATENT DOCUMENTS

| | | | |
|---|---|---|---|
| EP | 699015 A1 | 2/1996 | H05B/33/08 |
| EP | 211791 A1 | 6/2002 | H02M/3/158 |
| FR | 2819121 | 7/2002 | H02M/7/5387 |

* cited by examiner

Primary Examiner—My-Trang Nu Ton
(74) Attorney, Agent, or Firm—George O. Saile; Stephen B. Ackerman

(57) ABSTRACT

A circuit and method are given, to realize a high-voltage control and driver interface as integrated circuit, especially for use in connection with four external components, inductor L and capacitor C as well as low-side and high-side switching transistors as found e.g. in half-bridges. The circuit is essentially self supplied by means of an Intrinsically floating auxiliary supply power generation and regulation scheme. The circuit is apt to supporting high main supply voltages up to 1000V. The circuit of the invention is realized without the need for any internal high-voltage integrated semiconductor devices. Exploiting the advantages of that solution the circuit of the invention is manufactured with standard CMOS technology and only four discrete external components, which is favorably lowering the cost of production.

132 Claims, 19 Drawing Sheets

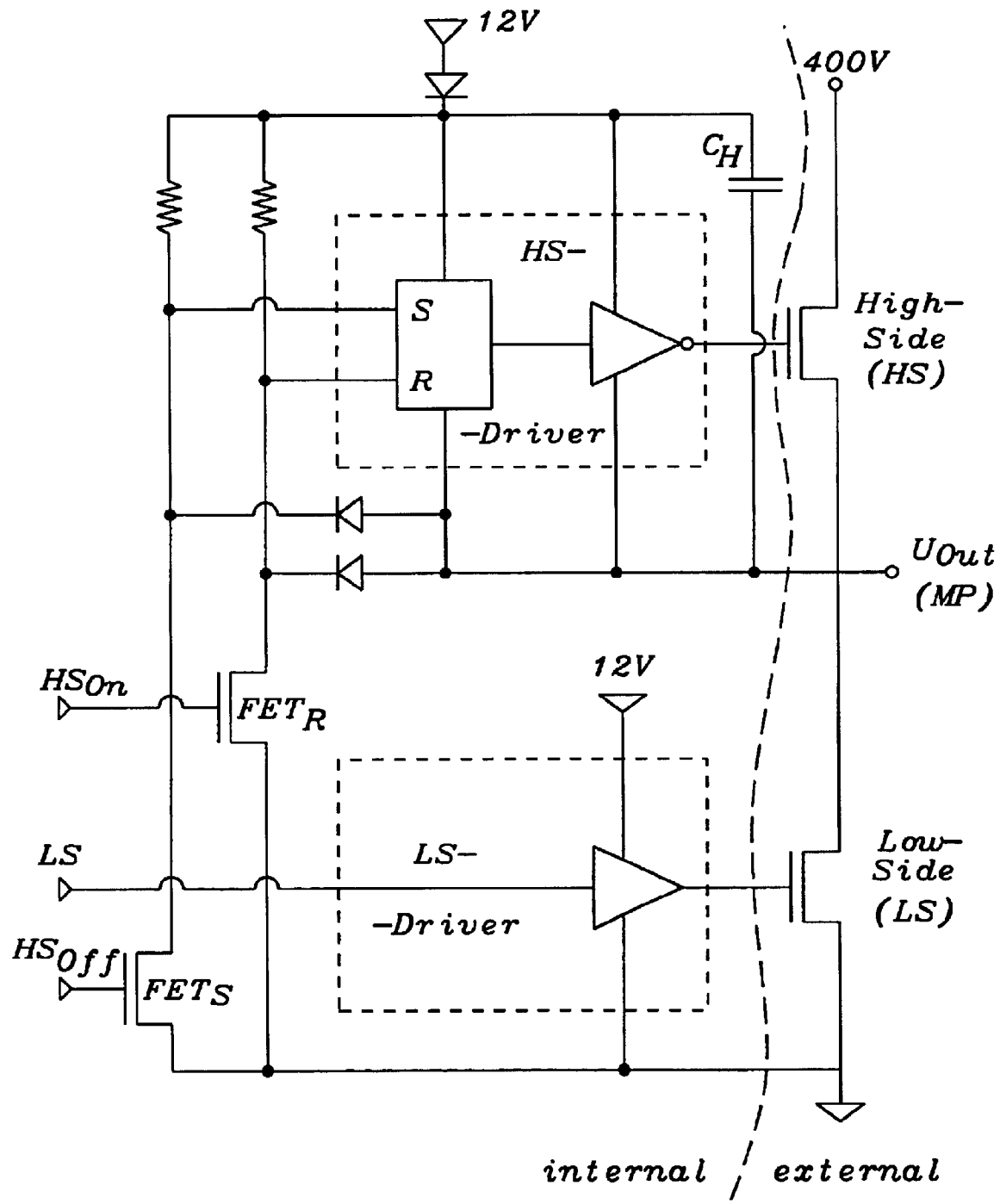
FIG. 1A – Prior Art

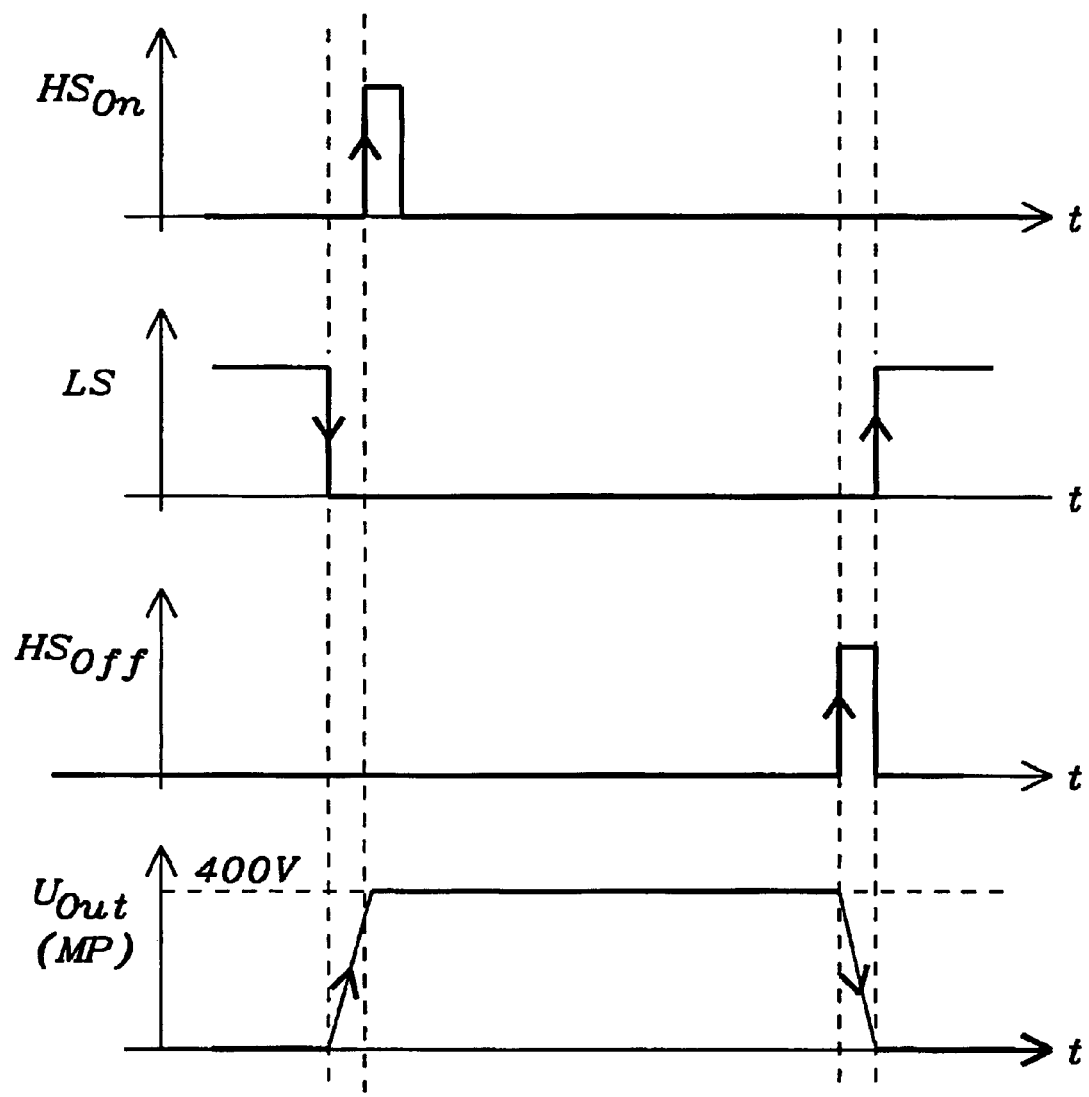
FIG. 1B - Prior Art

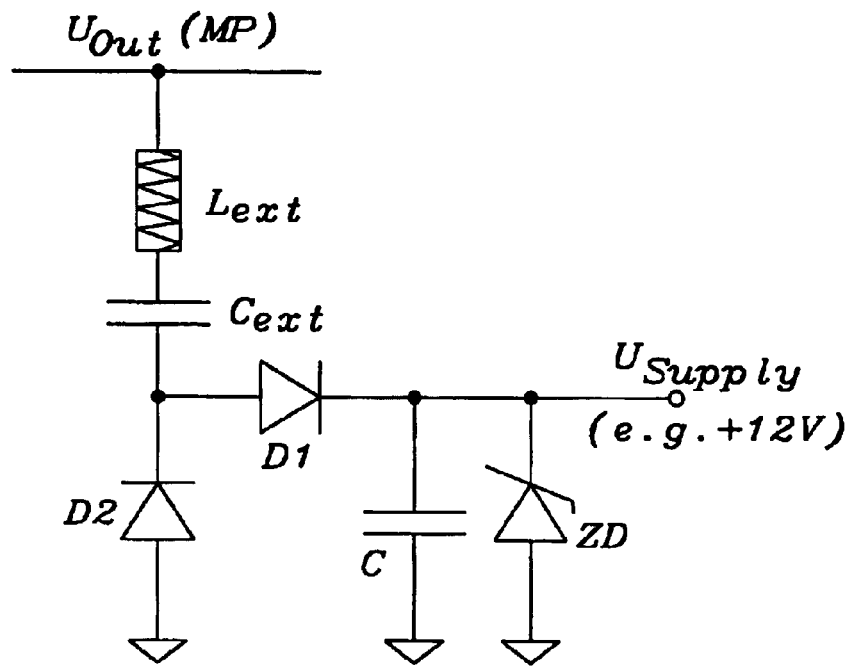
*FIG. 1C - Prior Art*
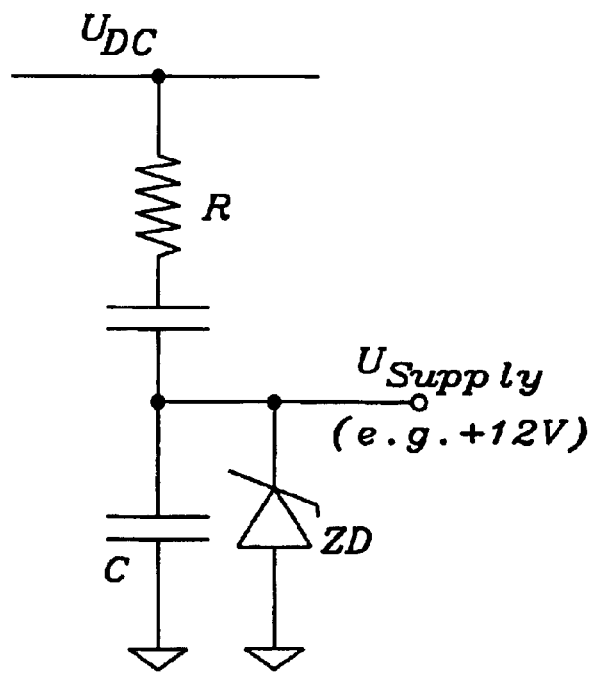
*FIG. 1D - Prior Art*

*Provide multiple external switching devices, arranged in serial connection between the given power and ground terminals of the circuit feeding the available main supply energy, and provide accordingly for each external switching device its own appropriate controller circuit together with its own, individually controlled and regulated appliance for the required auxiliary energy supply* — 610

*Provide separate and individual storage means for said different supply energies and provide internal switches — internal to said controller circuits — for transporting, controlling and regulating said energies* — 620

*Provide means for generating, processing and storing information data within said controller circuits for the purpose of control and regulation of each of said supply energies as defined above* — 630

*Provide means for transfer and/or exchange of said information data with an isolating internal potential separation as means for transferring information within and between said controller circuits* — 640

*Start-up an initial bootstrap procedure for controlling and regulating said available main supply energy with said external switching devices, together with generating said auxiliary supply energies, as needed for regular operating said controller circuits* — 650

HIGH-VOLTAGE INTERFACE AND DRIVER CONTROL CIRCUIT

BACKGROUND OF THE INVENTION

(1) Field of the Invention

The invention relates generally to electronic circuits for higher voltages and in particular to half-bridge interface and driver circuits or interfaces realized with integrated-circuit technologies.

(2) Description of the Prior Art

Particularly designed special interface and driver circuits in electronic applications are required, when it comes to handling higher power and voltage levels within half-bridge driver control circuits for lights, motors and other types of actuators. This is a noted and quite common requirement for such electronic circuits very frequently employed in the home appliances and automotive industries; for example for lighting purposes, for drives in washing machines, for engine fan control, for electric power assisted steering, or for wiper and seat positioning systems and so on Therefore the handling of higher voltage levels is an elementary demand. The specific and eligible circuits for these applications are so-called half-bridge branches and full-bridge or H-bridge circuits normally used in single or triple phase configurations. The H-bridge designation vividly depicts the arrangement of the four utilized field effect switching transistors. Said circuits are generally operating together with so-called low-side or bottom and high-side or top control and gate driver interfaces.

Realizations of the prior art for such driver circuits are often implemented as specifically tailored semiconductor circuits, fulfilling the operational demands regarding the higher voltages and the elevated power requirements. Therefore, when a higher voltage handling and mastery is obligatory sometimes DMOS (Double diffused Metal Oxide Semiconductor) transistor devices are used, making necessary an expensive process in semiconductor fabrication. Alternatively specialized integrated circuits incorporating CMOS (Complementary MOS) devices with extended drain realizations are employed, which leads also to more expensive components. Another solution is the choice of discrete high-voltage transistor or thyristor devices fabricated with e.g. IGBT (Insulated Gate Bipolar Transistor) technologies or VMESH (Vertical MESHed transistor arrays). Furthermore these driver circuits have to be interconnected with some logic circuitry, which is controlling the overall operation of the driven electrical devices. These logic circuits or even microprocessor systems normally are working with low voltages. The cooperation within these two voltage domains—one for higher, the other for lower voltages—has to be realized. Thereto an appropriately combined semiconductor technology capable of handling all these demands is chosen, which most often leads to costly solutions.

Referring now to FIGS. 1A prior art, 1B prior art, 1C prior art, and 1D prior art, the description of a circuit in prior art integrated circuit (1C) realization of said half-bridge is given. The so-called half-bridge is made up of two NMOS (N-channel MOS) transistors, named High-Side (HS) and Low-Side (LS) transistors, which are the only external components in this implementation, and which are shown as externally separated by the waved line in the drawing from the internal parts of the IC described here, all arranged to the left of this line. The HS-transistor is connected at one side to the main high voltage supply (400V) and at its other side to the output or Mid-Point (MP) terminal of said half-bridge. From there the connection is carried on to one side of the LS-transistor, which in turn is leading via its other side to the ground terminal of the circuit. These two transistors are forming one branch of a bridge structure, the other branch being of identical formation and the load balance in the full bridge being achievable or established between the two mid-points respectively. The gates of each of the two transistors in said half-bridge branch are controlled and driven by corresponding gate driver circuit blocks, named HS-Driver and LS-Driver respectively (shown with dashed outlines in the drawing). These driver circuits are differing from each other in such a way, that the HS-Driver includes a data storing means (e.g. an RS—flip-flop), for memorizing the information pertaining to the on-off status of the HS-transistor of the branch. This allows for controlling the HS-Driver circuit with short on-off impulses $HS_{On}$ and $HS_{Off}$ (see FIG. 1B prior art) via the two level shifting field effect transistors $FET_S$ and $FET_R$. This voltage level translation is necessary, because the potential of the reference pin—which is connected to the mid-point (MP) with voltage $U_{Out}$—of the HS-Driver block is elevated to the high voltage level (400V), when the HS-transistor is closed. The short controlling impulses are advantageous, because they allow for a simpler since less powerful and therefore cheaper implementation of the level shifting high-voltage transistors $FET_S$ and $FET_R$, which have to exhibit a high $U_{DS}$ breakthrough voltage, withstanding the maximum occurring potential shift value. A current technology for e.g. 500V as needed here, exhibits therefore a 2–3 $\mu$m oxide sheet strength. The LS-Driver circuit does not need such precautions; the reference potential of which is never rising because of its permanent tie to ground. The control signal LS may therefore be a direct image of the LS-transistor on-off state and thus of the voltage curve for the mid-point voltage $U_{Out}$. It should be understood, that this prior art solution for the engineering task and its circuit is only one possible example, there are many other solutions not discussed here. Nevertheless they altogether contain means for the level translation problem.

Looking now at FIG. 1B prior art the aforementioned characteristics of the control signals $HS_{On}$ and $HS_{Off}$ together with signal LS are depicted, governing the behavior of the mid-point voltage $U_{Out}$.

Referring now to FIGS. 1C prior art and 1D prior art, two possible circuits for the creation of the auxiliary supply voltage $U_{Supply}$ (e.g.+12V) for the two driver circuits in FIG. 1B prior art are given. The first circuit (FIG. 1D prior art) to be explained is a simple Zener-diode (ZD) stabilized voltage generation (derived from the pulsed DC voltage $U_{DC}$) circuit with a resistor R (for high voltage to current conversion) and a capacitor C (for energy storage). However here the current, that can be drawn from this standard circuit is limited to very low values (appr. 1 mA), due to the high internal resistance of the circuit. The second circuit (FIG. 1C prior art) should overcome this limitation and could be described as a two-way rectifying diode network, its internal resistance being parameterizable to much lower values. The usable current (also derived from a pulsed DC voltage, here $U_{Out}$ at the mid-point MP of a half-bridge) may then be increased to several 10 mA. The function of the coil $L_{ext}$ is to simply limit the inrush current into the capacitor $C_{ext}$.

Amongst the prior art solutions more elaborate voltage shifter or voltage translation circuits can be found, as well as potential level isolating solutions with e.g. transformers or optical couplers. It is therefore a challenge for the designer of such circuits to achieve a high-quality, but lower-cost solution.

There are various patents referring to such solutions.

U.S. Pat. No. RE36,480 (to Bourgeois, et al.) describes a control and monitoring device for a power switch, one terminal of which is at a floating reference voltage. The circuit comprises a level translating portion, which is designed to transmit, from another control circuit, orders to the power switch control circuit, or conversely, to receive monitoring information.

U.S. Pat. No. 6,151,233 (to Kondo) discloses a synchronous rectifier circuit. In a switching power circuit adopting this synchronous rectifying system, when a first switch is cut-off, current $I_L$ of an inducing element is maintained by a commutating diode, and the inducing element releases energy which was stored in the conduction period of the first switch. A second switch connected in parallel to the commutating diode is made conducting so as not to overlapp with the conduction period of the first switch. In the conduction period of the second switch, the current $I_L$ does not flow through the commutating diode, and it is possible to prevent lowering of efficiency caused by forward voltage drop. An inducing element current detecting circuit monitors the current $I_L$ and, when the current $I_L$ is reversing its direction, instructs a control circuit to cut-off the second switch. As a result, no reverse current flows through the inducing element even when the load is small, thus realizing a switching power circuit always having high efficiency.

U.S. Pat. No. 6,184,716 (to Depetro et al.) describes a high-voltage final output stage for driving an electric load, of the type which comprises a complementary pair of transistors connected between first and second supply voltage references, and at least one PMOS pull-up transistor connected in series with an NMOS pull-down transistor. The stage comprises an additional PMOS transistor connected in parallel with the pull-up transistor and having the body terminal in common therewith. More particularly, the body terminals of both PMOS transistors are formed in the semiconductor within a common well which can withstand high voltages, and the additional transistor is a thick oxide PMOS power transistor.

U.S. Pat. No. 6,445,623 (to Zhang, et al.) describes charge pumps with current sources for regulation. A charge pump circuit is provided for reducing the voltage ripple and EMI associated with prior art circuits. The charge pump circuit is configured with at least one current source for suitably controlling the charging and/or discharging current in the charge pump capacitors. The currents of the current sources are determined by the load current requirements, rather than the on-resistance of any switches or the ESR of any capacitors, thus allowing a significant reduction of the peak current drawn from the power supply as well as the peak current injected into the output reservoir capacitor. The charge pump circuit can be configured with a current source in series with the input supply voltage to control the total current in the charge pump. In addition, the charge pump circuit can be configured with current limited switches for controlling the total current. For example, current sources can be suitably configured to replace one or more switches in the charge pump circuit to effectively control the total current in the charge pump circuit. By feeding the charge pump capacitors with switched current sources, the voltage across the current sources can be suitably limited to the supply voltage or the output voltage. In addition, the current sources can operate as resistor devices with adjustable impedances, and be configured to suitably reduce or eliminate the excessive supply voltage across the current sources. Further, the switched current sources can comprise various current mirror configurations. As a result, the requirement for the breakdown voltage can be significantly reduced. In addition, through use of a low voltage process, the cost and packaging size can be suitably reduced.

SUMMARY OF THE INVENTION

A principal object of the present invention is to provide an effective and very producible method and circuit as design principle for supplying potential-elevated circuit blocks i.e. circuit blocks floating at higher voltage levels with supply energy.

Another further object of the present invention is to apply these circuits and methods as design principle with monolithic integrated circuit technology without the need for using integrated high-voltage components.

Another still further object of the present invention is to reach an application of this principle with half-bridge circuits.

A still further object of the present invention is to reduce the power consumption of the circuit by realizing inherent appropriate design features.

Another object of this invention is its producibility as a monolithic semiconductor integrated circuit.

Also an object of the present invention is to reduce the cost of manufacturing by implementing the circuit as a monolithic integrated circuit in low cost CMOS technology.

Also another object of the present invention is to reduce cost by effectively minimizing the number of expensive components.

In accordance with the objects of this invention, a method for controlling and driving external higher voltage switching devices, such as transistors, thyristors or triacs e.g. which are configured as a half-bridge circuit branch, i.e. forming an output voltage terminal as mid-point between a high-side and a low-side switch, both connected in series between a main supply voltage terminal, furnishing the main supply energy and a ground terminal respectively is given. Said method includes providing low-side and high-side switching devices, for each switching device an attached integrated controller circuit containing four internal switches arranged as two pairs, providing means for generating, processing and storing as well as transmitting/receiving information data, means for transferring information, means for a potential separation and isolation of said means for transferring information, storage means for said main supply energy, a first storage means for low-side auxiliary supply energy, a second storage means for high-side auxiliary supply energy. Further serves this method for arranging said external low-side switching device and said external high-side switching device in serial connection between said given power or high-side terminal and said ground or low-side terminal of the circuit, used for feeding input of said available main supply energy, thus creating said mid-point terminal for said output voltage between said two respectively attached high-side and low-side external switching devices. It is also needed for associating to said external low-side switching device said integrated low-side controller circuit together with an individually controlled and regulated low-side appliance for its required low-side auxiliary energy supply as said, altogether named master controller circuit and associating to said external high-side switching device said integrated high-side controller circuit together with an individually controlled and regulated high-side appliance for its required high-side auxiliary energy supply as said, altogether named slave controller circuit. Also included in that method is assigning said main supply energy to said storage means, placed between and connected to said integrated master controller circuit and said integrated slave controller circuit as well as assigning said low-side auxiliary supply energy to said first storage means, connected to said integrated master controller circuit and assigning said high-side auxiliary supply energy to said second storage means, connected to said integrated slave controller circuit. Equally includes that method collocating the transporting and controlling of said main energy as well as said individually regulated low-side and high-side auxiliary supply energies to said two pairs of internal low-side and high-side switches, internal to said integrated low-side and high-side controller circuits. Also included in that method is collocating the generating, processing, and storing of said information data to said integrated low-side and said integrated high-side controller circuits for the purpose of control and regulation of each of said supply energies and collocating for the transferring and/or exchanging of said information data with said isolating internal potential separation said means for transferring information between said master controller circuit and said slave controller circuit. Furtheron is needed in that method starting-up an initial bootstrap procedure for controlling and regulating said available main supply energy with said external switching devices; together with generating said low-side and high-side auxiliary supply energies for said master controller and said slave controller circuits, generating, processing, and storing said information data, within said two integrated master and slave controller circuits for the purpose of transportation, control and regulation of said main supply energy and said first and said second auxiliary supply energies in order to solve the required control task; setting-up and following a four segment time slot scheme; realizing said controlling of said four internal low-side and high-side switches with the help of said master and slave controller circuits and implementing said driving of said master and slave controller circuits using said generated information data within the rules of said time slot scheme. Said method also comprises preparing transfer and/or exchange of said information data by transmitting/receiving said information data with said means for transferring information within and between said integrated master and slave controller circuits; preparing said means for transmitting/receiving said information data as said means for transferring information within said integrated master controller circuit and preparing said means for receiving/transmitting said information data as said means for transferring information within said integrated slave controller circuit. Said method comprehends also setting-up the controlling and driving of said external low-side and said external high-side switching devices with the help of said master and said slave controller circuits using said information data; controlling and driving said low-side switching device with the help of said integrated master controller circuit; controlling and driving said high-side switching device with the help of said integrated slave controller circuit; transferring and/or exchanging said information data between said integrated master and said integrated slave controller circuits with said means for transferring information; transmitting/receiving said information data with said means for transferring information at said integrated master controller circuit and receiving/transmitting said information data with said means for transferring information at said integrated slave controller circuit. Furtheron is implied transporting and storing said energies between and in said storage devices with the help of said four internal switches; and at the same time controlling and regulating said stored auxiliary supply energies within the framework of said time slot scheme. Also implied in said method is transporting during the first time segment of said time slot scheme a controlled amount of said main supply energy into said means for storing said main supply energy and into said means for storing said low-side auxiliary supply energy; storing said controlled amount of said main supply energy into said storage means for said main supply energy; storing said controlled amount of said low-side auxiliary supply energy for said integrated master controller circuit into said first storage means; transporting during the second time segment of said time slot scheme a controlled amount from said stored main supply energy into said means for storing said high-side auxiliary supply energy; storing said controlled amount of said high-side auxiliary supply energy for said integrated slave controller circuit into said second storage means; transporting during the third time segment of said time slot scheme a controlled amount of said main supply energy into said means for storing said main supply energy; storing said controlled amount of main supply energy into said storage means for said main supply energy; transporting during the fourth time segment of said time slot scheme a controlled amount of said main supply energy to ground, thus reducing said main supply energy; and keeping the remainder of said main supply energy stored in said storage means for said main supply energy. Also contained in said method is controlling of said stored low-side and said stored high-side auxiliary supply energies by regulating its voltages according to the boundary conditions to be kept for the required control solution and controlling of said output voltage at said mid-point terminal by regulating its behavior in such a way, that the required control task for the circuit is properly solved as well as closing the operation loop by getting back to the first step after said initial bootstrap procedure and repeating this loop action permanently during the regular operation of the circuit looping-back operation.

Also in accordance with the objects of this invention, a more general method, for controlling and driving higher voltage switching devices, such as transistors, thyristors or triacs e.g. arranged within a circuit branch in serial connection and thus forming output voltage terminals as mid-points between consecutive switching devices, all connected in series between a main supply voltage terminal furnishing the main supply energy and a ground terminal respectively is established. This general method includes providing more than one of said external switching devices, an integrated master controller circuit, several integrated slave controller circuits and both types of circuits containing internal switches, means for generating, processing, and storing information data, means for transmitting/receiving said information data, means for transferring information; means for potential separation and isolation, storage means for said main supply energy, and several storage means for auxiliary supply energies. Said method specifies arranging said several external switching devices in serial connection between said power terminal of the circuit, feeding input for the available main supply energy and said ground terminal; associating to each of said external switching device its own appropriate controller circuit together with its own, individually controlled and regulated appliance for the required auxiliary energy supply and assigning for said main supply energy and said different supply energies said separate and individual storage means. Also implied in said general method is transporting, controlling and regulating said energies with the help of said internal switches in said integrated master controller circuit and in said several integrated slave controller circuits; generating, processing, and storing information data within said controller circuits for the purpose of control and regulation of each supply energy; transferring and/or exchanging of said information data with a sufficiently isolating internal potential separation as means for transferring information within and between said controller circuits. The general method comprises starting-up an initial bootstrap procedure for controlling and regulating said available main supply energy with said external switching devices together with generating said auxiliary supply energies, as needed for regular operation of said controller circuits; generating, processing, and storing said information data within said controller circuits for the purpose of transportation as well as control and regulation of said every single supply energy, in order to solve the required control task; setting-up and following a multi segment time slot scheme; controlling and driving of said internal switching devices with the help of said controller circuits and said generated information data within the rules of said time slot scheme; and transferring and/or exchanging of said information data by transmitting and receiving said information data with said means for transferring information between said controller circuits. Furtheron needed with said general method is setting-up of the controlling and the driving of said external switching devices with the help of said information data using said controller circuits; transporting and storing said energies between and in said storage devices with the help of said internal switches; controlling and regulating said stored auxiliary supply energies according to the boundary conditions to be kept for the required control solution; synchronizing all that within the framework of said time slot scheme; and at the same time operating regularly in a closed loop of operations.

Also in accordance with the objects of this invention, a circuit, capable of controlling and driving higher voltage switching devices, such as transistors, thyristors or triacs e.g. which are configured as a half-bridge circuit branch, i.e. forming an output voltage terminal as mid-point between a high-side and a low-side switch, both connected in series between a main supply voltage terminal, furnishing the main supply energy and a ground terminal respectively is developed. Said circuit comprises means for controlling and driving said low-side switching device, designated as integrated master controller circuit; means for controlling and driving said high-side switching device, designated as integrated slave controller circuit; means for generating, storing, and processing information data, within said integrated master controller circuit and said integrated slave controller circuit; and means for transmitting and/or receiving information data, within said integrated master controller circuit and said integrated slave controller circuit as well as means for transferring information data, between said integrated master controller circuit and said integrated slave controller circuit. Also contained in said circuit are means for potential separation and isolation of said means for transferring information between said integrated master controller circuit and said integrated slave controller circuit. Finally comprises said circuit means for storing the main supply energy, placed between and connected to said integrated master controller circuit and said integrated slave controller circuit; means for storing the low-side auxiliary supply energy for said integrated master controller circuit; means for storing the high-side auxiliary supply energy for said integrated slave controller circuit; means for transporting said main supply energy into said means for storing said low-side auxiliary supply energy; means for transporting said main supply energy into said means for storing said high-side auxiliary supply energy. Necessary in said circuit are further means for generating, controlling and regulating said low-side and said high-side auxiliary supply energies; and means for starting-up the operation of said means for generating, controlling and regulating said low-side and said high-side auxiliary supply energies during an initial bootstrapping procedure.

BRIEF DESCRIPTION OF THE DRAWINGS

In the accompanying drawings forming a material part of this description, the details of the invention are shown:

FIG. 1A prior art shows the prior art electrical circuit schematics with two internal circuit blocks named HS-Driver and LS-Driver, used as gate drivers for the high-side (HS) and low-side (LS) transistors in a half-bridge realization of the prior art.

FIG. 1B prior art illustrates the prior art applied control signals and the behavior of the output voltage for the circuit of FIG. 1A prior art in form of a timing diagram.

FIG. 1C prior art shows the prior art electrical circuit schematics for an auxiliary supply voltage generation from the output voltage in a prior art realization.

FIG. 1D prior art gives the prior art electrical circuit schematics for a simple prior art voltage stabilization, which is used here only for generation of the startup voltage directly out of any rectified voltage.

FIGS. 6A and 6B illustrate as flow diagrams the general method how to accomplish the generation and regulation of the supply and gate driving voltages at cotroller and driver circuits for several external switching devices with a generlized circuits embodiment of the invention.

DESCRIPTION OF THE PREFERRED EMBODIMENTS

The preferred embodiments disclose a novel circuit for half-bridge circuit branches or full-bridge or H-bridge circuits normally used in single or triple phase configurations and their low-side and high-side control and gate driver interfaces. Key of the invention is a circuit for the generation and regulation of the supply voltages for the two gate driver circuits, as needed for driving the high-side and low-side transistors in said half-bridge in a high-voltage implementation and the method therefore.

The description of the preferred embodiment of the invention is elaborated now by explaining the circuit on the one hand and by presenting the method on the other hand.

Figure 2:
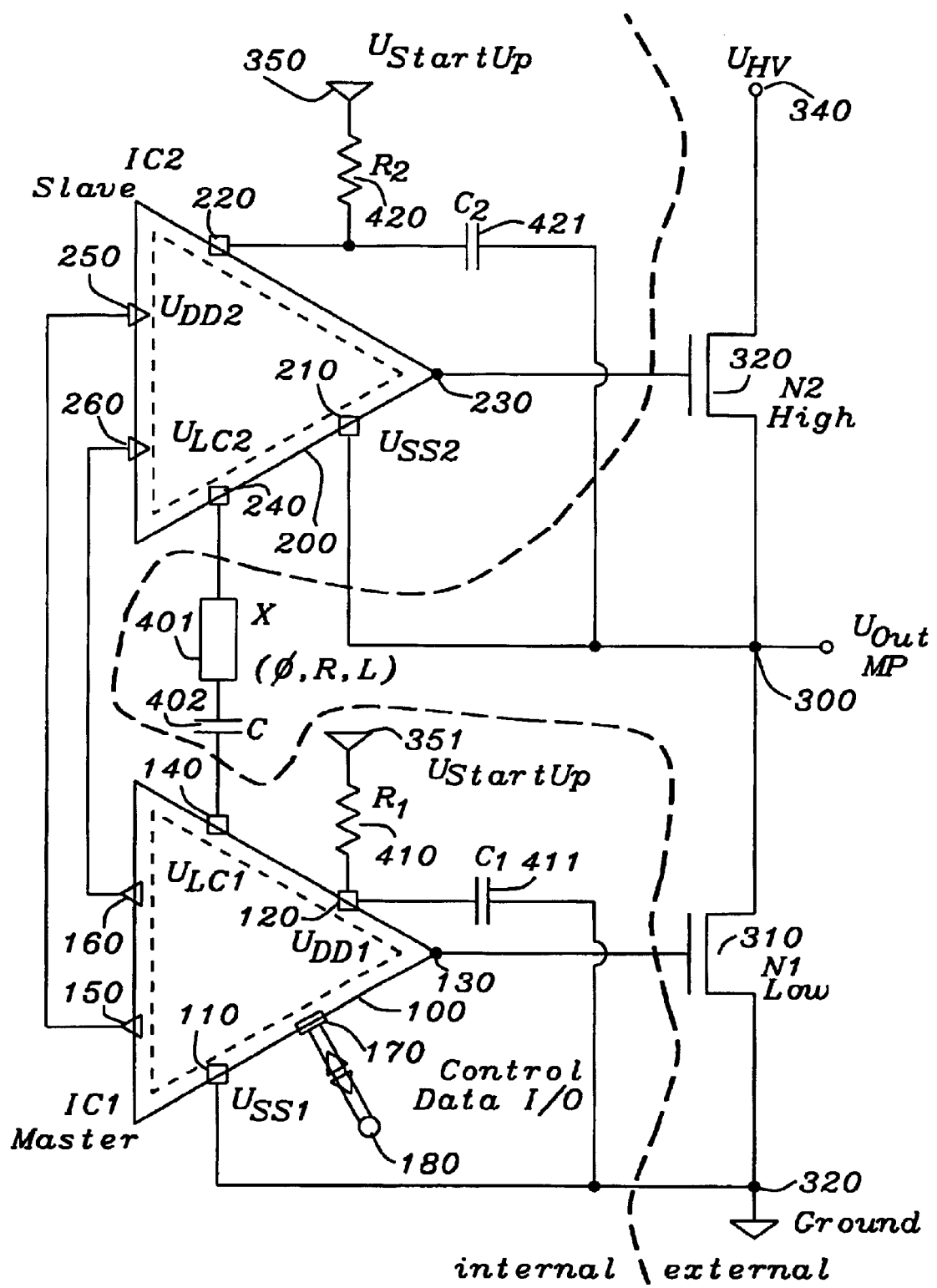
FIG. 2 depicts the general electrical circuit schematics for the preferred embodiment of the present invention, with all denominations but without details. Two internal circuit blocks named IC1 and IC2 used as gate drivers for the high-side and low-side transistors in a half-bridge realization are prepared for a layered circuits and overlay presentation (details see FIGS. 3A and 3B).

Referring now to FIG. 2, the preferred embodiment of the circuit of the present invention is illustrated. The essential functional components of the driver circuit according to the invention are shown in FIG. 2 in the form of a combined circuit schematic and block diagram. The view onto this figure serves mainly for an explanation of the overall structure of the circuit of the invention with their most essential parts and further also to introduce most of the denominations used. The underlying engineering task to be solved with the invention is to build a high-voltage half-bridge circuit branch, consisting of two NMOS transistors together with their respectively associated control and gate driver circuits. Starting off with the two—under this viewpoint—nearly identically built-up parts, one for the low side and the other for the high side of the half-bridge, each consisting of an NMOS transistor ($N_{1\ Low}$- item 310—and $N_{2\ High}$ - item 320) as low-side and high-side bridge transistors, a corresponding integrated circuit (IC1- item 100—and IC2- item 200) as control and gate driver circuit, which is depicted as a particular solid triangular part in FIG. 2, and a dedicated RC-network ($R_1$, $C_1$ (items 410 and 411) and $R_2$, $C_2$ (items 420 and 421)) we describe and explain every part and function in greater detail in the following. Inasmuch as the only additionally incorporated external components are firstly a generic element X, a general resistive element or two-pole, which may in its specific instances be implemented as a simple straight wire 0 with zero resistance or as a resistor R or as an inductor L or any combinations thereof (item 401) and secondly the energy storage capacitor C (item 402) and both components being serially connected and arranged between said integrated control and gate driver circuits IC1 and IC2; they may then be called together as an entity: XC-combination. In the following only the specific case will be observed and described, where X is implemented as an inductor L, but without any limitation of the universality as given per description before and in this case these components will then be named as LC-combination. The functionality of said integrated control and gate driver circuits IC1 and IC2 in the circuit of the invention may also be subsumed with their denomination as master and slave controllers. Said master controller (IC1) has two I/O signal—terminals (items 150 and 160), one driver output terminal (item 130), one pin (item 140) for connecting said serial LC-combination with its voltage $U_{LC1}$, one pin (item 120) for the connection of said dedicated RC-network ($R_1$,$C_1$) with its supply voltage $U_{DD1}$, and one reference pin (item 110) with its voltage $U_{SS1}$. Furtheron needed is a channel for the exchange of the control data between this master controller and the external circuitry, shown as a bus terminal and denominated Control Data I/O (item 180). For simplicity this Control Data I/O bus terminal is not shown any more in the subsequent drawings; Instead of the implementation for the transfer of parallel bus signals shown here also an implementation for a serial signal transfer may be used. Said slave controller (IC2) accordingly has two I/O signal-terminals (items 250 and 260), one driver output terminal (item 230), one pin (item 240) for connecting again said serial LC-combination with its voltage $U_{LC2}$, one pin (item 220) for the connection of said dedicated RC-network ($R_2$,$C_2$) with its supply voltage $U_{DD2}$, and one reference pin (item 210) with its voltage $U_{SS2}$. The interior triangles shown in dashed lines within the particular solid triangles, representing IC1 and IC2 portend to two enclosed and completely different functions within said controller and driver circuit blocks, which are later on shown and explained conveniently in two different and separate pictures (see FIGS. 3A and 3B), which may therefore be interpreted as functional overlays to FIG. 2. Reverting now to FIG. 2, as can be seen from the picture, the only external components in the whole circuit shown are said two NMOS transistors $N_{1\ Low}$ and $N_{2\ High}$ and said serial LC-components (L and C), separated with a waved line in the drawing from all the other internal parts. The notions external and internal within this context have to be understood with respect to an implementation of this preferred embodiment of the invention as a monolithic semiconductor circuit. Now continuing the description of FIG. 2, we find said resistors $R_1$ and $R_2$ of said dedicated RC-networks ($R_1$,$C_1$ and $R_2$,$C_2$) being connected at one side to a startup voltage signal $U_{StartUp}$ and at the other side to said pins with their voltages $U_{DD1}$ and $U_{DD2}$ of IC1 and IC2 respectively, wherefrom said capacitors $C_1$ and $C_2$ are leading to said pins with their voltages $U_{SS1}$ and $U_{SS2}$ of IC1 and IC2 respectively. It shall be emphasized at this point, that the pin with voltage $U_{SS1}$ is connected to the ground terminal, named as Ground (item 320) and that the pin with voltage $U_{SS2}$ is connected to the output voltage $U_{Out}$ at the mid-point, named MP (item 300) of the half-bridge circuit branch. The denominations "low side" and "high side" of the half-bridge thus get more descriptive, when we think of the possible high voltage values for $U_{out}$—which can be raised to the high voltage value $U_{HV}$ of the main supply terminal (item 340), provided the FET-switch NMOS transistor $N_{2\ High}$ is closed—and the normally low ground terminal voltage value. Terminating our description of FIG. 2 only the wiring of the two I/O connections of the circuit blocks IC1 and IC2 has yet to be defined, in the embodiment considered here said I/O connections are essentially in parallel from one circuit (IC1) to the other (IC2), i.e. items 160 and 260 are wired together, and items 150 to 250 correspondingly. Finishing the explanation of the circuit and its function we determine that the auxiliary supply voltage generation part (see FIG. 3A) and the data transfer and control signal part (see FIG. 3B) are described separately relating to said already above introduced function overlays.

Figure 3A:
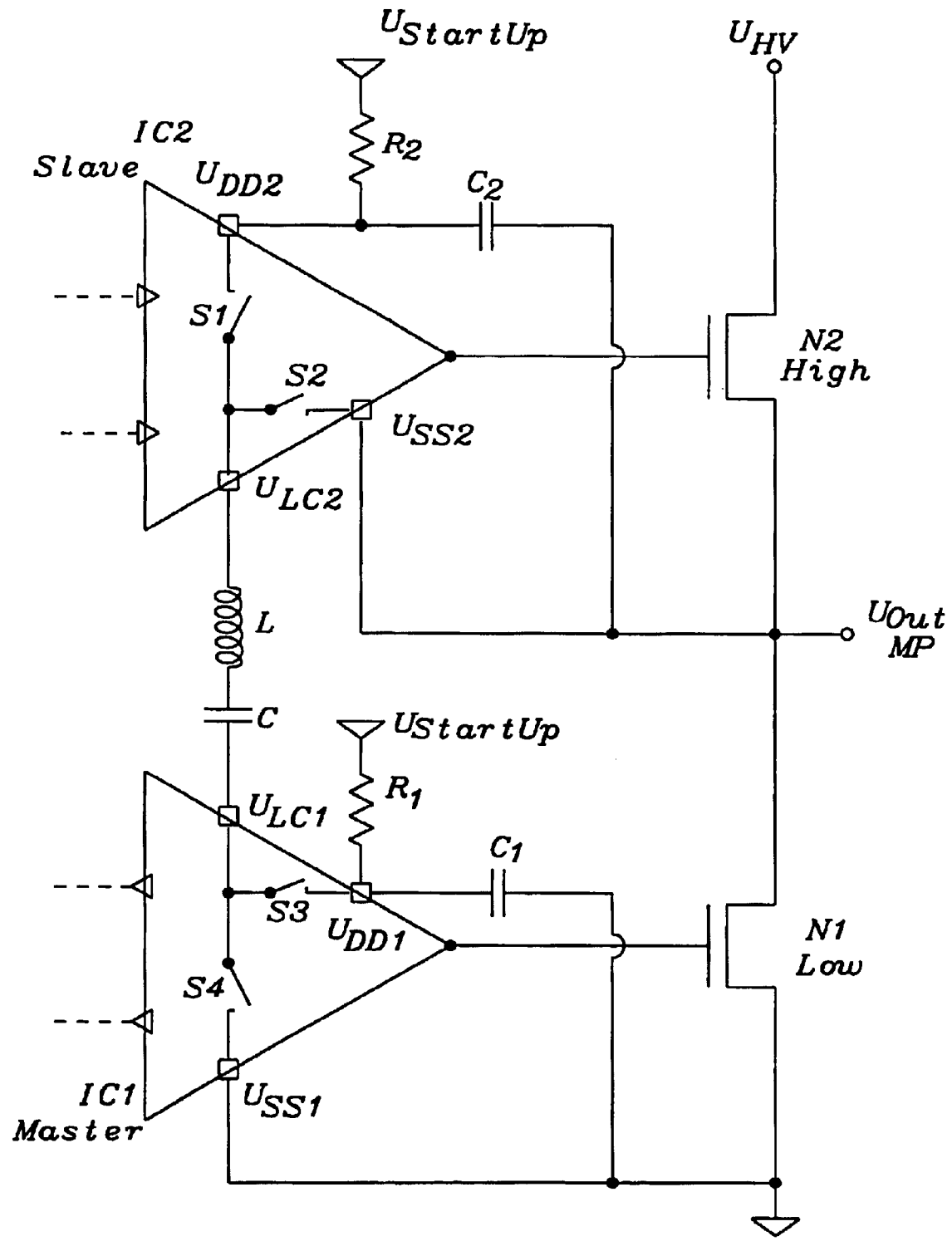
FIG. 3A presents the electrical circuit schematics with a first circuit overlay at IC1 and IC2 of FIG. 2 showing the internal switch layer structure used for the preferred embodiment of the present invention.

Dwelling now on FIG. 3A, illustrating the auxiliary supply voltage generation part with the circuit of the invention and shown as one layer of the aformentioned overlays, we recognize, that every control and gate driver interface (IC1 and IC2) contains a pair of controlled switches (denominated S3, S4 and S1, S2 respectively). These switches are at each case connected in one common point, which in turn connects to said external LC-combination at the respective pin with its voltages $U_{LC1}$ and $U_{LC2}$ respectively. The other ends of the corresponding switches S4 and S2 are then wired at each case to the pin with the reference potential ($U_{SS1}$ and $U_{SS2}$) of the respective interface circuit (IC1 and IC2). And again, the other ends of the corresponding switches 53 and S1 are wired at each case to the pin with the auxiliary supply potential ($U_{DD1}$ and $U_{DD2}$) of the respective interface circuit (IC1 and IC2), where the common point of the corresponding RC-network ($R_1, C_1$ and $R_2, C_2$) is connected. By an appropriate operation of these switches (S1 . . . S4)—to some extent as for switches used in active rectifiers—and synchronized with the on/off-state of the bridge transistors ($N_{1\ Low}$ and $N_{2\ High}$) it is feasible, that a charge pump is established for every interface circuit (IC1 and IC2). At this point the following remarks about charge pump circuits may be helpful; they are sometimes vizualized as "bucket and cup" circuits, bucket being the large flying energy transporting capacitor and cup the energy receiving (charged) smaller load capacitor. A more theoretical point of view is that charge pump circuits contain necessarily three circuit elements: a flying capacitor as energy storing and transfer element, a self-sustaining clock mechanism to start the converting process and keep it going, and a switch or diode network, which constrains the energy to flow In a prescribed direction. The charged capacitors here are $C_1$ and $C_2$ respectively (part of said RC-networks). The accomplished voltages $U_{DD1}$ and $U_{DD2}$ of said capacitors hence serve as auxiliary supply voltages for the interface circuits (IC1 and IC2) themselves; the charge pump set-up here is not to be confused with charge pumps for boosting only the gate drivers capabilities, as found elsewhere. The resistors $R_1$ and $R_2$ respectively have to serve as initial current suppliers in a bootstrap phase, feeded with said start-up voltage signal $U_{StartUp}$. The energy storing, flying capacitor C is part of said LC-combination. The inductor L as part of said LC-combination serves as an inrush current limiting device thereby. The on/off-control of the NMOS bridge transistors is established via the high-voltage gate of transistor $N_{2\ High}$ and the low-voltage gate of transistor $N_{1\ Low}$. These gates are appropriately driven by said driver outputs of said interface circuits (IC1 and IC2) themselves. The means for that controlling function are explained with the help of FIG. 3B, describing the other layer of said overlays.

Figure 3B:
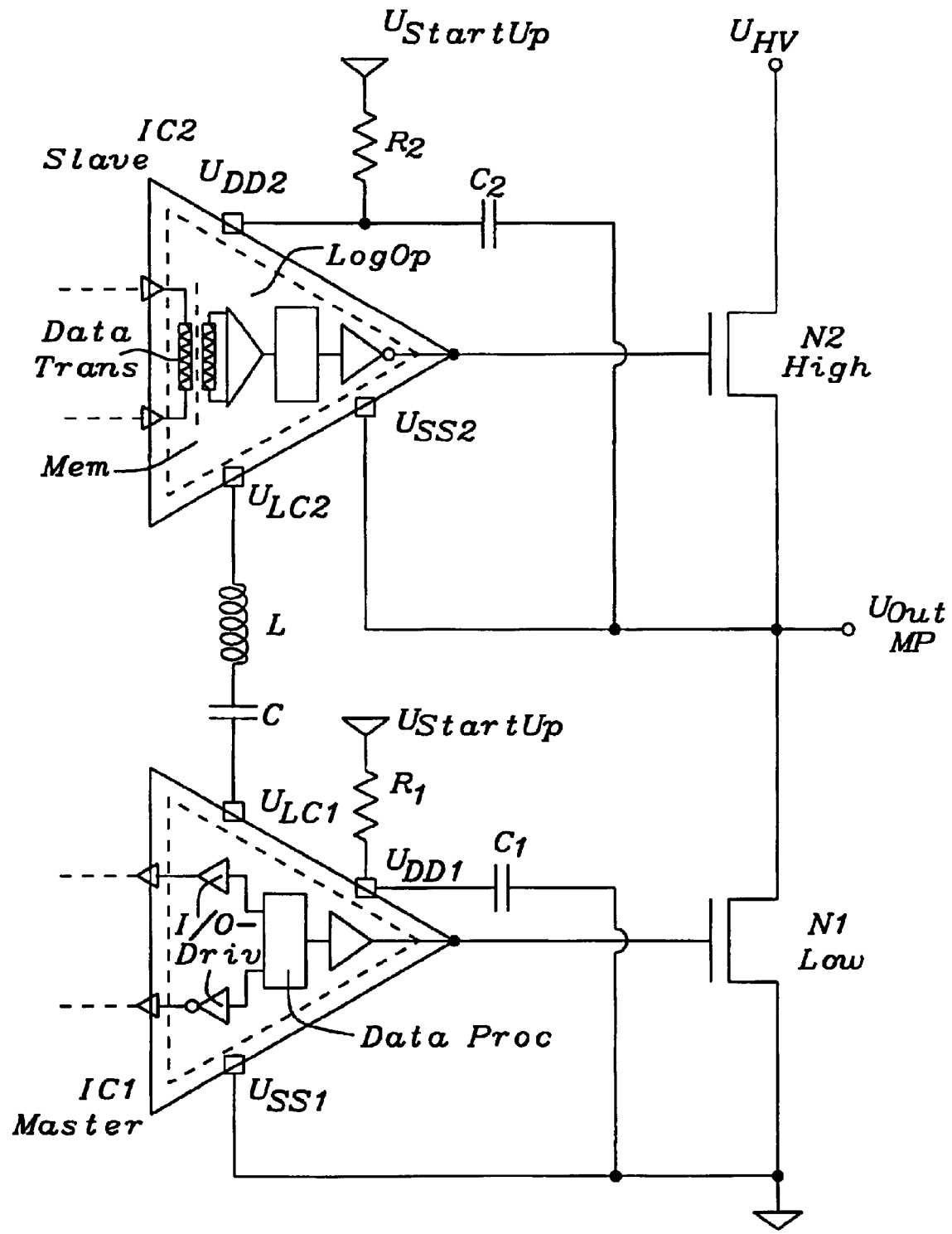
FIG. 3B presents the electrical circuit schematics with a second circuit overlay at IC1 and IC2 of FIG. 2 showing the two internal data and control layers for the preferred embodiment of the present invention. The potential isolating means named DataTrans, here shown as an inductive transformer may be implemented also with differential capacitors, optoelectronic couplers or couplers using Giant Magnetoresistance (GMR) materials. For simplicity only one type is shown in the drawings.

Regarding now FIG. 3B, Illustrating the data transfer and control signal part with the circuit of the invention and shown as the other layer of the aformentioned overlays, we find different means for signal generation and data processing in these layers of said interface circuits (IC1 and IC2). Besides that, they each have both in common a gate driving output for the respective bridge transistors, because both (external) N-channel transistors have to be controlled separately. The low-side driver interface IC1, working as a master controller contains data storing, clocking and processing (DataProc) means as well as I/O drivers (I/O-Driv) for said data. The high-side driver interface IC2, working as a slave controller contains a data transfer (DataTrans) device as well as means for logical data operations (LogOp) and information storage (Mem). The purpose of the data transfer device is a potential separation by means for electrical isolation, implemented as an on-chip transformer for example. This potential separation has to be provided, because at this point the possible high-voltage difference of the output signal $U_{Out}$ becomes effective. On-chip transformers, needed here for data transfer only are realized as simple two coil transformers with a larger isolation. To meet the high-voltage requirements in terms of break-down voltage between the two coils, the fabrication process in current CMOS technology demanding two standard metal layers necessitates one additional metal layer for the secondary coil with an extra thick oxide sheet strength (about 1 . . . 5 $\mu$m). This oxide will then exhibit a break-down voltage in the range of 1000 V, depending upon the quality of the silicon-dioxide but sufficient for the data transfer of the signal communication between the low-side and the high-side driver interfaces. Although we have to use here the cutting edge of the technology, the expense for this additional fabrication step is kept within reasonable limits, because of our use of said transformer for the limited purpose of data transfer only.

It should be mentioned in this context, that other, differing methods for potential separation and isolation exist and may be implemented as well. They include opto-couplers or opto-isolators as well as differential capacitor circuits and the use of Giant MagnetoResistive (GMR) materials as in Isoloop magnetic couplers, especially when high data transfer rates and good noise immunity are wanted. A thorough representation of the combined switching and its timing, together with the behavior of the controlled output voltage $U_{Out}$ is given later in FIGS. 5A and 5B. Beforehand some fundamental operating principles have to be introduced and explained, which can be clearly understood, considering the structure of the circuit of the invention as revealed until now. The main function of the circuit as a half-bridge branch is thus primarily determining the switching sequence and duration of the on-off states of the NMOS transistors, i.e. the pulse diagrams of the gate driving voltages. Before going into a more detailed explanation, some background information on the H-bridge will be helpful. The classic H-bridge allows a motor (more general: load) to be driven in two directions (more general: manners). As already mentioned, the name is derived from the obvious appearance of the four transistors and the motor compared to the letter H. By switching on two transistors in the bridge, the top right (HS) transistor and bottom left (LS) transistor for example, the motor is driven in one way and by alternatively turning on the other two transistors, the motor is driven in the other direction. A short-circuit occurs when two transistors (HS and LS) are switched on at the same time on the same side of the H-structure, e.g. the top left and the bottom left transistors, exactly those two transistors of a half-bridge, as dealt with here. Such a short-circuit condition has to be avoided under all circumstances, because it would lead inevitably to a destruction of the device, considering the high-voltage operation regime the device is designed for. Other possible situations occur, when either both top (HS) transistors or both bottom (LS) transistors are switched on at the same time. This operation leads to breaking or a hold of the motor. Ideally, the transistors in an H-bridge would be lossless switches that would switch synchronously and would be driven by logic level voltages. In reality, the transistors always have some internal impedance, and the logic signals driving the bridge always require some extra conditioning to drive the transistors. Furtheron the desirable regulation of speed (power) for the motor (load) leads to the application of additional pulse width modulation (PWM) schemes, ending up in even more sophisticated pulse diagrams for the controlling gate voltages. For our purposes here—driving the bridge transistors correctly and reliably operating the internal charge pump mechanism, a four segment scheme for said pulse diagram is adopted. These four segments in time are denominated as said time segments I–IV, already introduced above. Where said time segment I, called "charging capacitor C1" and also said time segment III, called "charging capacitor C" find transistor $N_2$ High switched on (closed) and transistor $N_{1\ Low}$ switched off (open), whereas said time segment II, called "charging capacitor C2" and also said time segment IV, called "discharging capacitor C" see transistor $N_2$ High switched off (open) and transistor $N_{1\ Low}$ switched on (closed). Synchronized hereto, the operation of said four internal switches S1–S4 must be controlled correctly. The operation of said charge-pump circuits is now in extenso depicted with FIGS. 4A–4D for every time segment. Some remarks pertaining to the transient behavior of voltages and currents for inductors and capacitors make it easier to understand the following explanations. The energy of a capacitor is determined by the voltage exhibiting across this capacitor, which does not allow for infinite jumps of that voltage. The current flowing through a capacitor is proportional to the first derivative in time of the voltage applied to this capacitor. The discharge of a capacitor, thus reducing the current flow of the same direction tends to lead to an inversion of the voltage; artificially keeping the voltage sign conserved instead, tends to lead to an inversion in the direction of the current flow. The energy of an inductor is determined by the current flowing through this inductor, which does not allow for infinite jumps of that current. The voltage exhibiting across an inductor is proportional to the first derivative in time of the current flowing through the inductor. The demagnetization of an inductor, thus reducing the voltage across the inductor of the same sign tends to lead to an inversion of the direction of the current flow, artificially keeping the current direction conserved instead, tends to lead to an inversion of the voltage across the inductor. Both elements and their electrical variables are said to be and behave dual to each other.

Figure 4A:
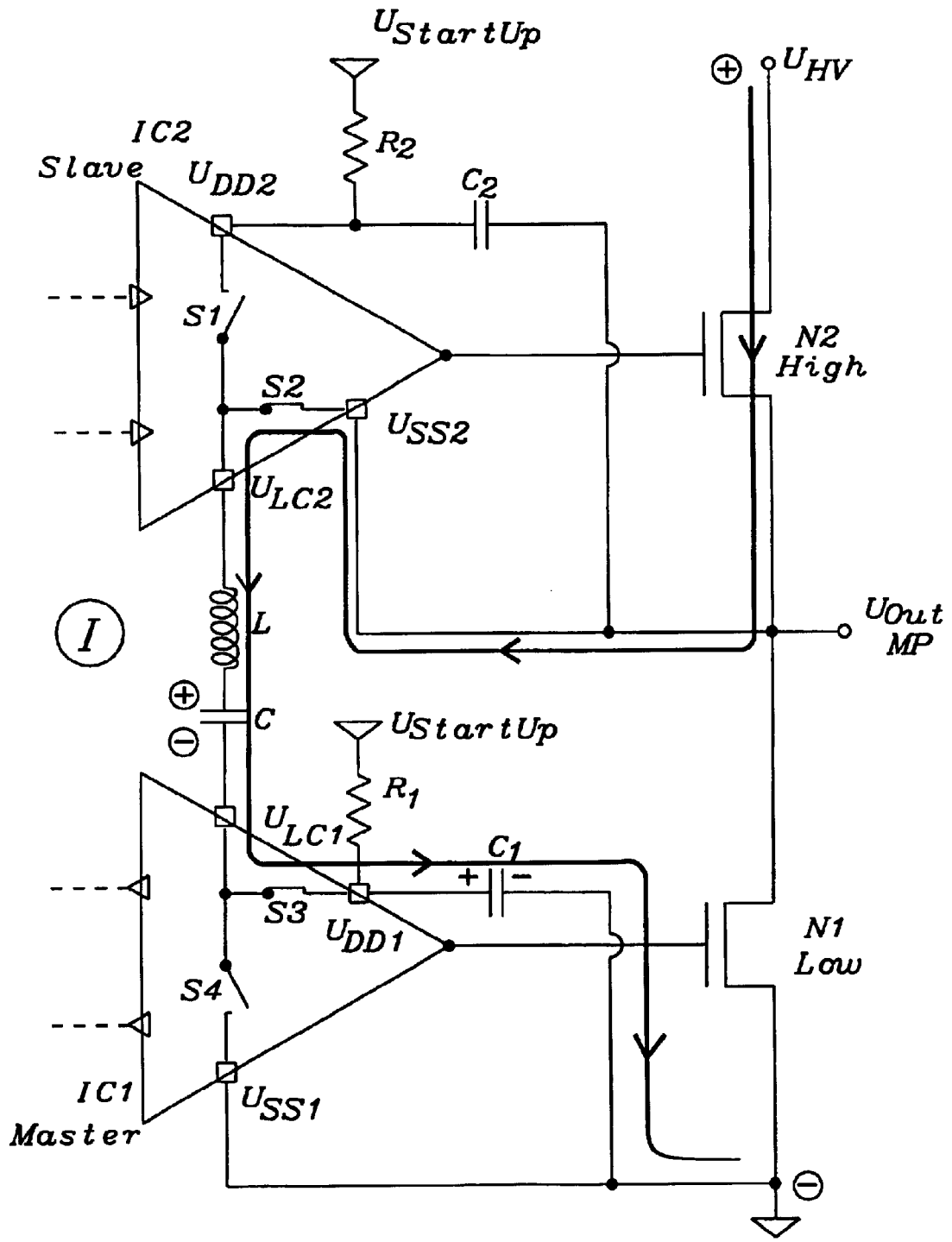
FIG. 4A shows the electrical circuit schematics with the first circuit overlay at IC1 and IC2 of FIG. 3A exposing the internal switch layer structure activated as in time segment 1, called "charging capacitor C1" and revealing the current flow for that time segment correspondingly.

Looking now at FIG. 4A, illustrating the auxiliary supply voltage generation part with the circuit of the invention and exposing the internal switch layer structure activated as in time segment 1, called "charging capacitor C1" and revealing the current flow for that time segment correspondingly we clearly identify the internal switches S2 and S3 as closed, and the internal switches S1 and S4 as opened. The external voltage $U_{VH}$ is activated via $N_{2\ High}$. The resulting current flows, as drawn in the picture, from the positive main supply voltage $U_{HV}$ via transistor $N_{2\ High}$ over switch S2 into said XC-combination here specialised to an LC-combination i.e. element X implemeted as inductor L—thus magnetizing L and charging C—and then over switch S3 into said capacitor $C_1$—thus charging $C_1$—to the ground terminal.

Figure 4B:
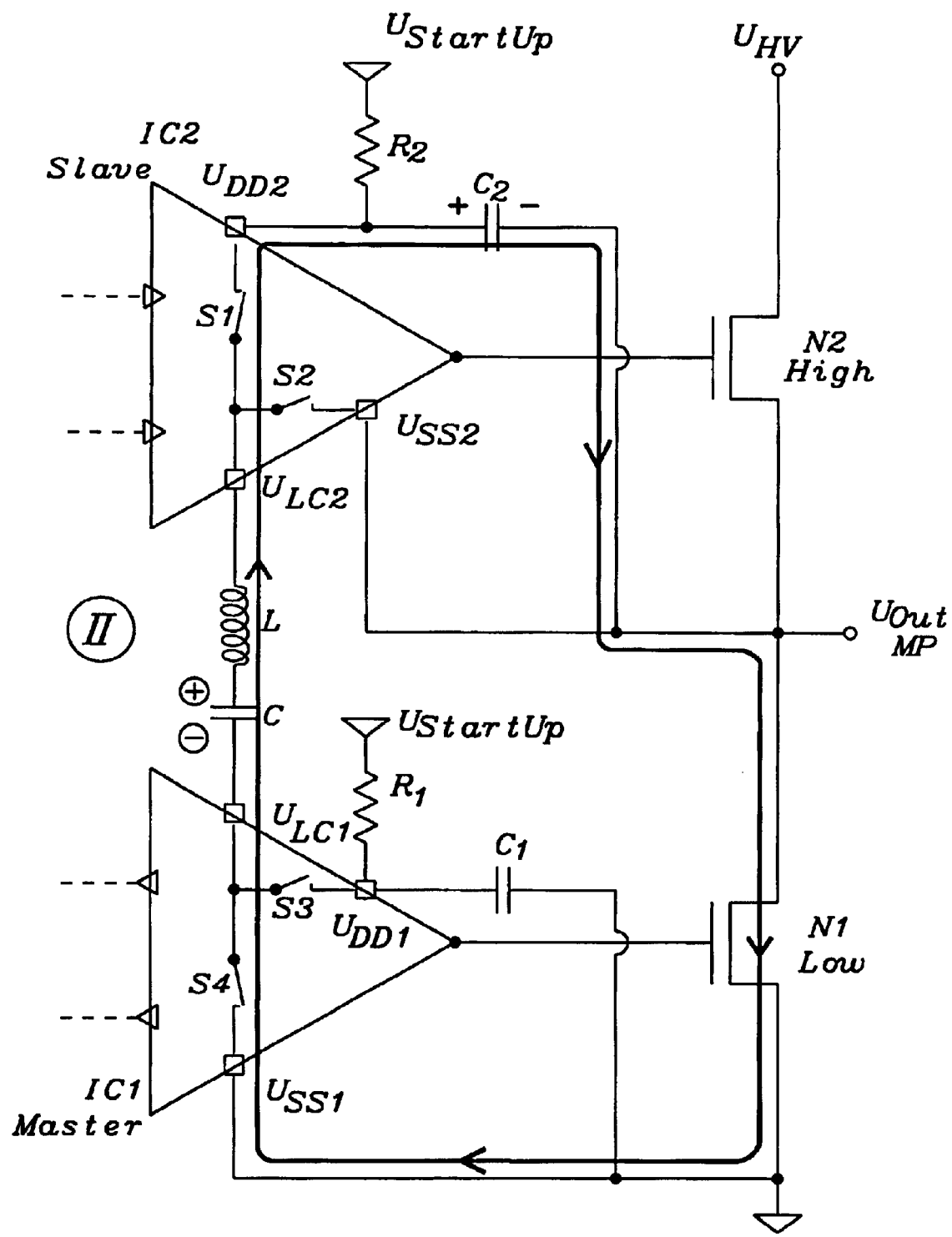
FIG. 4B shows the electrical circuit schematics with the first circuit overlay at IC1 and IC2 of FIG. 3A exposing the internal switch layer structure activated as in time segment 11, called "charging capacitor C2" and revealing the current flow for that time segment correspondingly.

Looking now at FIG. 4B, illustrating the auxiliary supply voltage generation part with the circuit of the invention and exposing the internal switch layer structure activated as in time segment 11, called "charging capacitor C2" and revealing the current flow for that time segment correspondingly we clearly identify the internal switches S1 and S4 as closed, and the internal switches S2 and S3 as opened. No external voltage source is active. The resulting current now flows, as drawn in the picture, from the internally stored energy with its main source stemming from the charge of capacitor C, part of said LC-combination, over the switch S1 into said capacitor $C_2$—thus charging $C_2$—via transistor $N_{1\ Low}$, and passing the ground terminal over switch S4 back again into said LC-combination—thus demagnetizing L and discharging C; where the loop is closed. The energy stored in inductor L is counteracting (the current flow is reverted compared to segment I) and thus diminishing the transient current during switching and the inrush current into capacitor $C_2$.

Figure 4C:
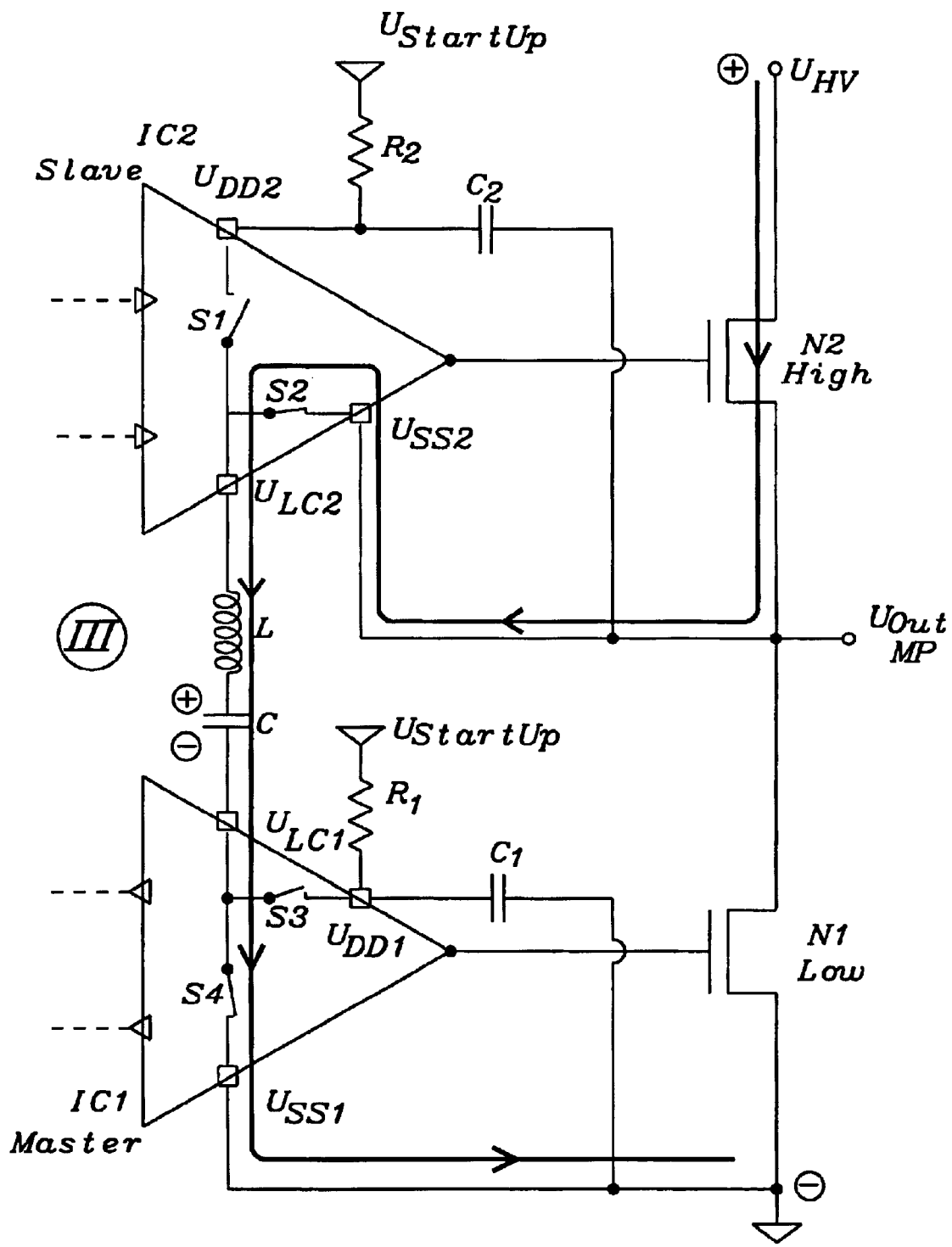
FIG. 4C shows the electrical circuit schematics with the first circuit overlay at IC1 and IC2 of FIG. 3A exposing the internal switch layer structure activated as in time segment IV, called "charging capacitor C" and revealing the current flow for that time segment correspondingly.

Looking now at FIG. 4C, illustrating the auxiliary supply voltage generation part with the circuit of the invention and exposing the internal switch layer structure activated as in time segment III, called "charging capacitor C" and revealing the current flow for that time segment correspondingly we clearly identify the internal switches S2 and S4 as closed, and the internal switches S1 and S3 as opened. The external voltage $U_{VH}$ is activated again via $N_{2\ High}$. The resulting current flows, as drawn in the picture, from the positive main supply voltage $U_{HV}$ via transistor $N_{2\ High}$ over switch S2 into said LC-combination—thus magnetizing L and charging C—and then over switch S4 to the ground terminal.

Figure 4D:
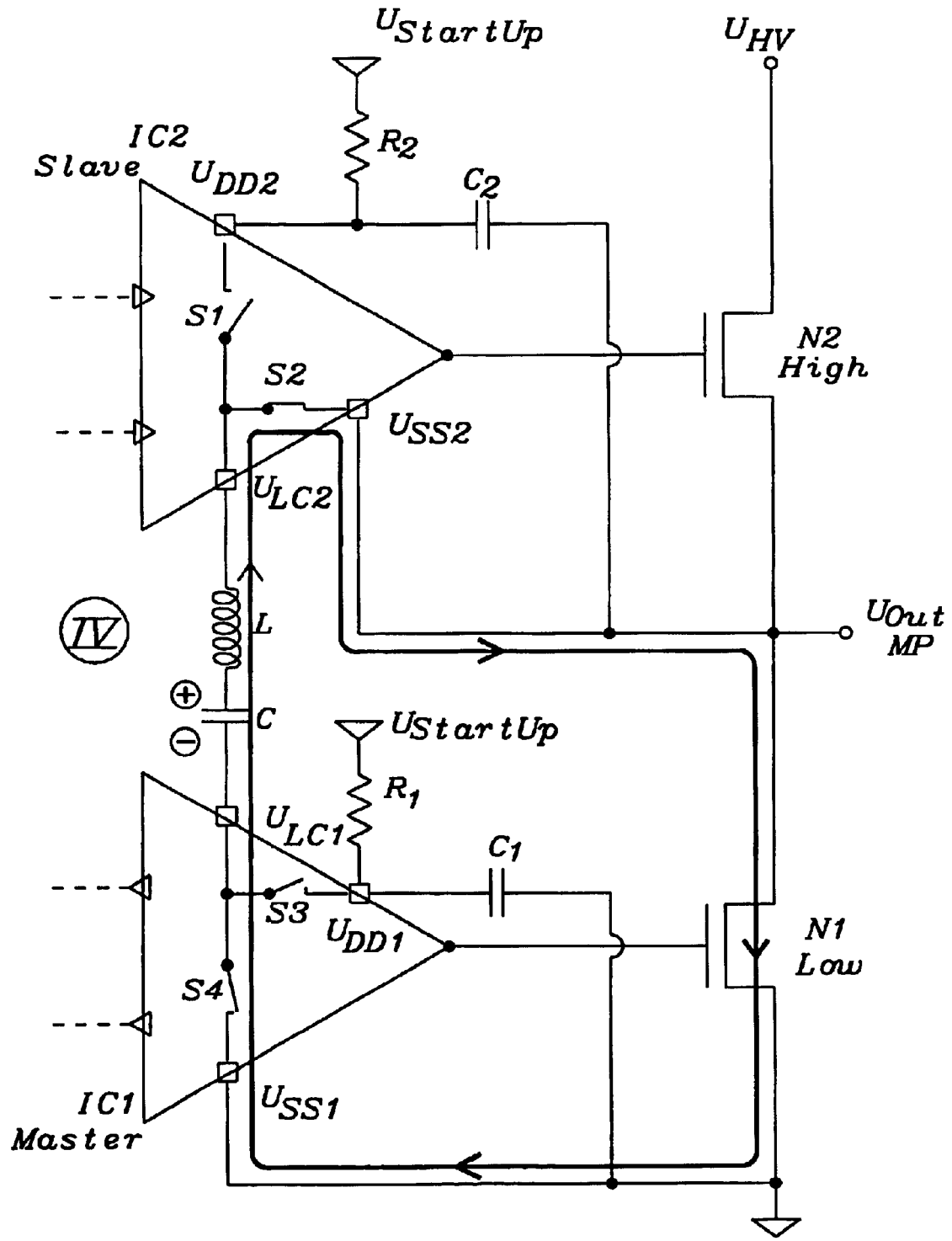
FIG. 4D shows the electrical circuit schematics with the first circuit over-lay at IC1 and IC2 of FIG. 3A exposing the internal switch layer structure activated as in time segment IV, called "discharging capacitor C" and revealing the current flow for that time segment correspondingly.

Looking now at FIG. 4D, illustrating the auxiliary supply voltage generation part with the circuit of the invention and exposing the internal switch layer structure activated as in time segment IV, called "discharging capacitor C" and revealing the current flow for that time segment correspondingly we clearly identify the internal switches S2 and S4 as closed, and the internal switches S1 and S3 as opened. Again no external voltage source is active. The resulting current now flows, as drawn in the picture, from the internally stored energy with its main source stemming from the charge of capacitor C, part of said LC-combination, over the switch S2 via transistor $N_{1\ Low}$, passing the ground terminal over switch S4 back again into said LC-combination—thus demagnetizing L and discharging C; where the loop is closed. The energy stored in inductor L is again counteracting (the current flow is reverted compared to segment III) and thus diminishing the transient current during switching.

Figure 5A:
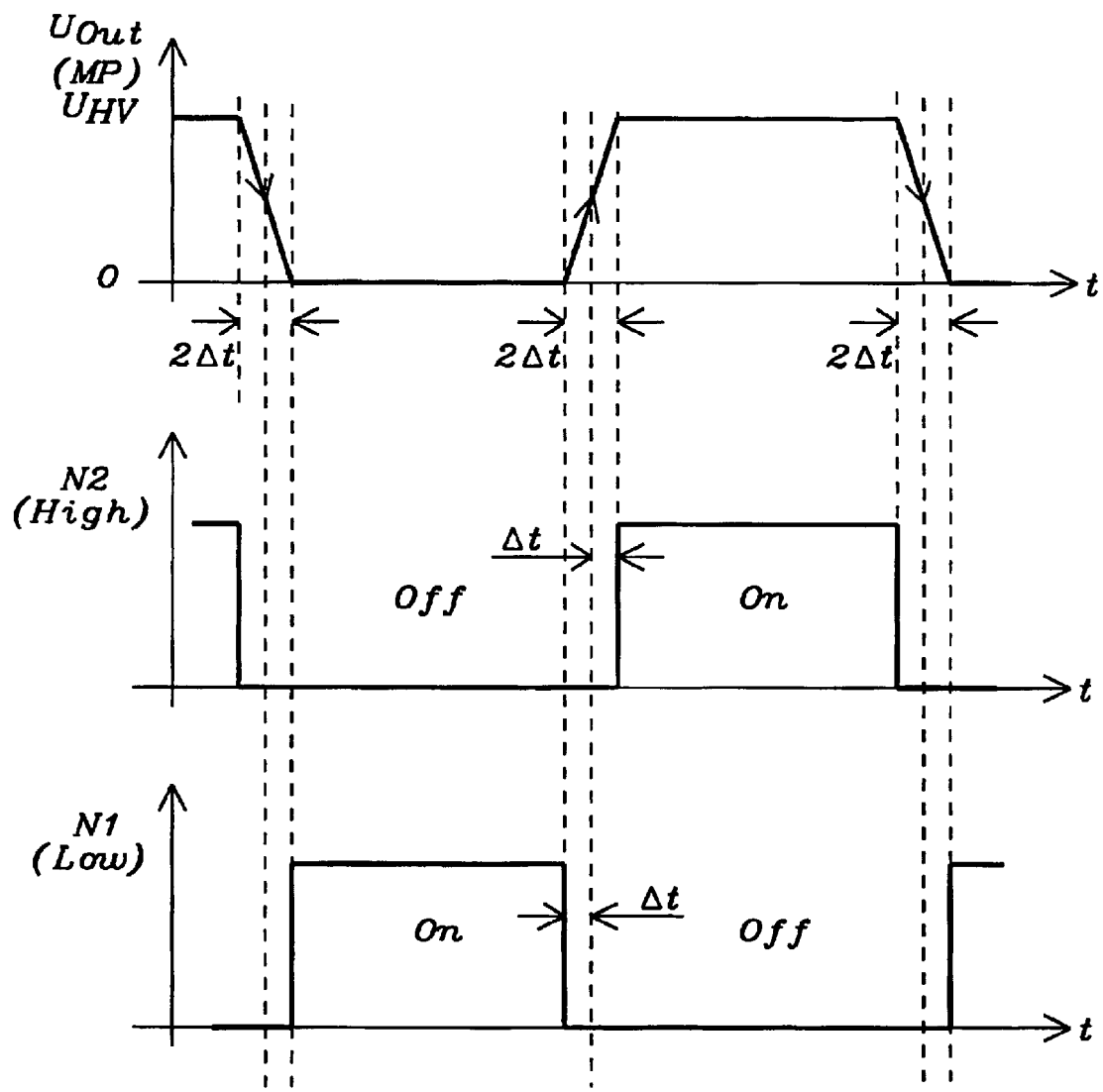
FIG. 5A shows the curve for the output voltage at midpoint of the half-bridge in the preferred embodiment of the present invention, depending upon the on-off state of the two bridge transistors N1 LOW and $N_{2\ High}$, equally shown in form of timing diagrams.
Figure 5B:
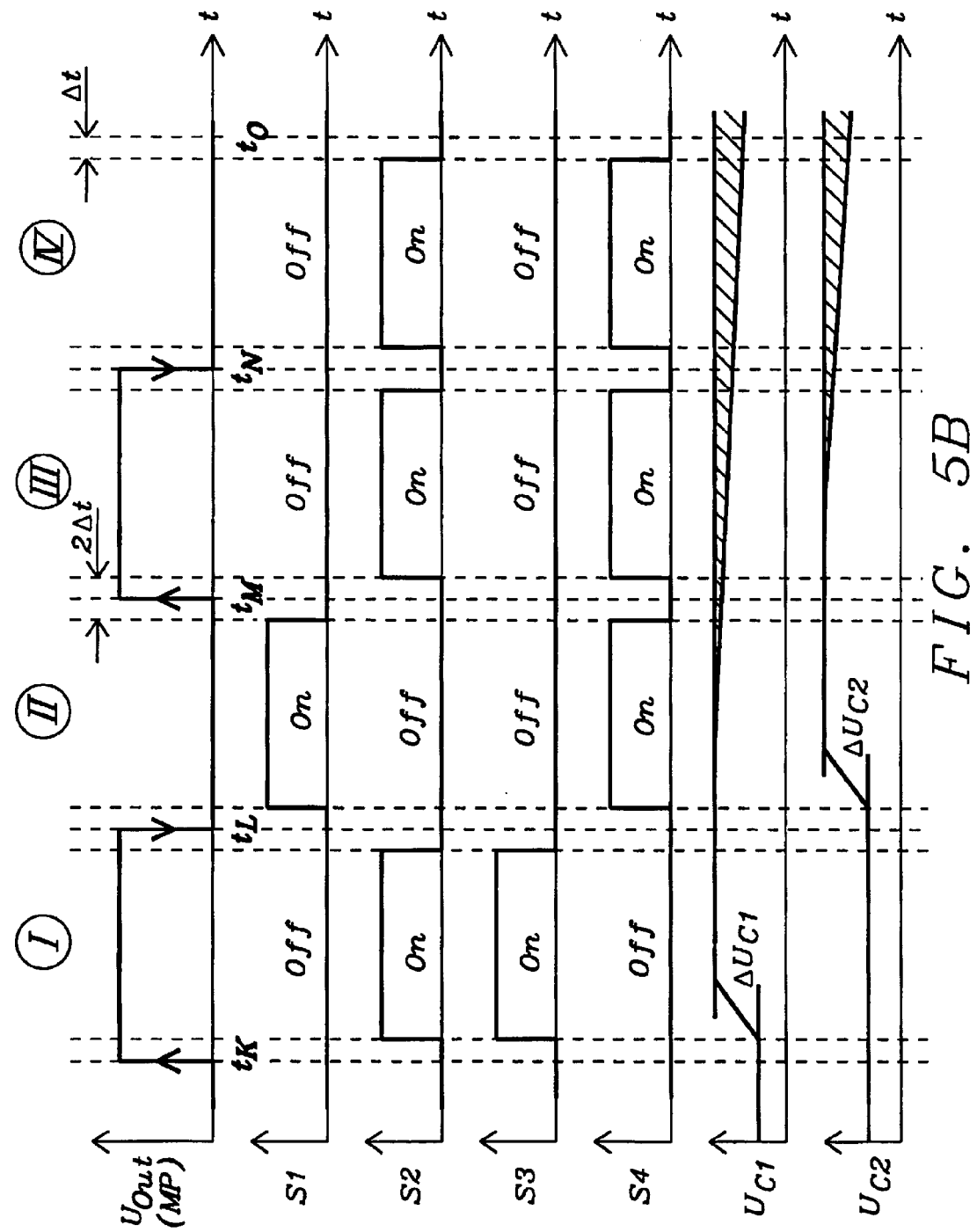
FIG. 5B shows as timing diagrams the four internal switch S1 . . . S4 on-off states together with the curve of the output voltage at mid-point of the half-bridge and the behavior of the voltages at capacitors $C_1$ and $C_2$ for the preferred embodiment of the present invention.

Referring now to FIG. 5A, which shows the curve for the output voltage $U_{Out}$ at mid-point of the half-bridge in the preferred embodiment of the present invention, depending upon the on-off state of the two bridge transistors $N_{1\ Low}$ and $N_{2\ High}$, shown underneath in form of timing diagrams, it can be understood, that no overlapping on-states can occur, short-circuiting the high-voltage $U_{HV}$ to ground, because of the incorporated little time gaps of size $2*\Delta t$ between the status changes. During that period $2*\Delta t$ the switching edges of the output voltage change its values.

Contemplating FIG. 5B, which shows again the curve for the output voltage $U_{Out}$ at mid-point of the half-bridge together with the timing diagrams for the four internal switch S1 ... S4 on-off states, these diagrams display at their time-axes (abscissa) five discrete time-marks $t_K$, $t_L$, $t_M$, $t_N$ and $t_O$; thus segmenting the time period observed into four time segments I, II, III, and IV. The relevance and meaning of said time segments have been extensively explicated and illustrated. Only the basic activities shall be repeated here. At the point in time $t_K$ "charging of capacitor C1" takes place, together with charging of capacitor C. At the point in time $t_L'$ "charging of capacitor C2" takes place. At the point in time $t_M$ "charging of capacitor C" takes place. At the point in time $t_N$ "discharging of capacitor C" takes place. The point in time to is identical again to $T_K$, thus closing the loop in time. Furthermore, the resulting behavior of the voltages $U_{C1}$ and $U_{C2}$ across the capacitors $C_1$ and $C_2$ respectively is plotted. The appearing voltages $U_{C1}$ and $U_{C2}$ are then used as auxiliary supply voltages $U_{DD1}$ and $U_{DD2}$ for the control and gate driver circuits IC1 and IC2 correspondingly within the circuit of the invention, as described and explained before in every detail. As can be seen from the diagrams, the generated auxiliary supply voltages $U_{C1}$ and $U_{C2}$ evince a certain ripple, $\Delta U_{C1}$ and $\Delta U_{C2}$ respectively. Some physical data and values may be given to top off the presentation—whereby it will be clearly understood, that these values are given here only as general example and that they should never limit this invention: absolute value of high main supply voltage: 20 V to 1000 V or higher; absolute values for auxiliary supply voltages $U_{C1}$, $U_{C2}$ respectively $U_{DD1}$ $U_{DD2}$: 8 V to 15 V; voltage ripple $\Delta U_{C1}$, $\Delta U_{C2}$: 0.1 to 3 V; auxiliary supply currents for IC1 and IC2, when the bridge is working within its normal operating range: about 3 mA to 30 mA; standard working frequency range of bridge, depending on application, e.g. needed speed for drives: from about 40 kHz up to 500 kHz (values again should not be understood as limitations).

Completion and/or expansion of the features for an intrinsic voltage regulation for the generated auxiliary supply voltages can be reached by pulse width modulating (PWM) of the switching periods in the time segments I–IV. This PWM control has to be made independently of the length of the time segments by sophisticated algorithms (effects not explicitly shown in the diagrams), controlling solely the absolute voltage values $U_{C1}$, $U_{C2}$ respectively $U_{DD1}$, $U_{DD2}$ according to the changing load situations. The indepence from the length of the time segments does however not signify any desynchronized situations, in fact this synchronization is a prerequisite for a regular operation of the circuit of the invention. Thus an operation like a regulated switching power supply is accomplished, where the internal switches S1–S4 are functioning as sort of active rectifiers or charge pump switches, according to the situation. Too low the regulated voltages get, the more capacitor charging is needed within the charge pump, too high the regulated voltages get, the more switching of energy from inductor and capacitors to ground is indicated.

A useful expansion opening up many more fields of applications for this invention is the possibility to apply an AC-voltage $U_{HV}$ instead of a DC-voltage $U_{HV}$ as supply voltage for the H-bridge. This necessitates adaptations and changes of some algorithms for the internal logical data processing, insofar as they must additionally be synchronized to the phase of the AC-voltage—in that case understood as some sort of active rectifier—concerning its modulation and regulation features. The main fields of application for such AC-voltage operations are lighting devices, even with several stages (more than two), serially connected in form of an external ladder circuit. Further mentioned here is the use of other semiconductor devices for the switches in the bridge or ladder circuits, thyristors or TRIACS or DIACS or bipolar transistors instead of field effect transistors (NMOS/PMOS-FETs).

Obvious for those skilled in the art is also the interchangeability of master and slave controller circuits in the case of the half-bridge structure, i.e. low-side and high-side controller circuits may adopt either the function of master or slave controllers or vice-versa. In the case of several switching devices the arrangement of the master controller circuit is arbitrary with respect to its position within the series of serially connected switches. All the remaining other controller circuits are then taking over their functions as slave controllers. In the descriptions of the preferred embodiment of the invention however, only a single one of these possible cases is shown and explained in detail. This holds for both the descriptions of the circuits of the invention and of the methods used in this invention.

The key-point and main advantage of the invention is however, that all these favorable features of the circuit of the invention are implemented and realized without the need for any internal high-voltage integrated semiconductor devices, like high-voltage diodes or high-voltage transistors. It is evident, that the facility to do without expensive high-voltage semiconductor devices is favorably lowering the cost of production. As can be understood by those skilled in the art, this general principle of an intrinsic generation of floating supply voltages may be applied to other interface or driver interface circuits, as taken for example here—presupposed the crucial external components: two-pole X and capacitor C (XC-combination) for main energy storage plus several storage elements for auxiliary supply energies as well as several external switching transistors are present.

Figure 6B:
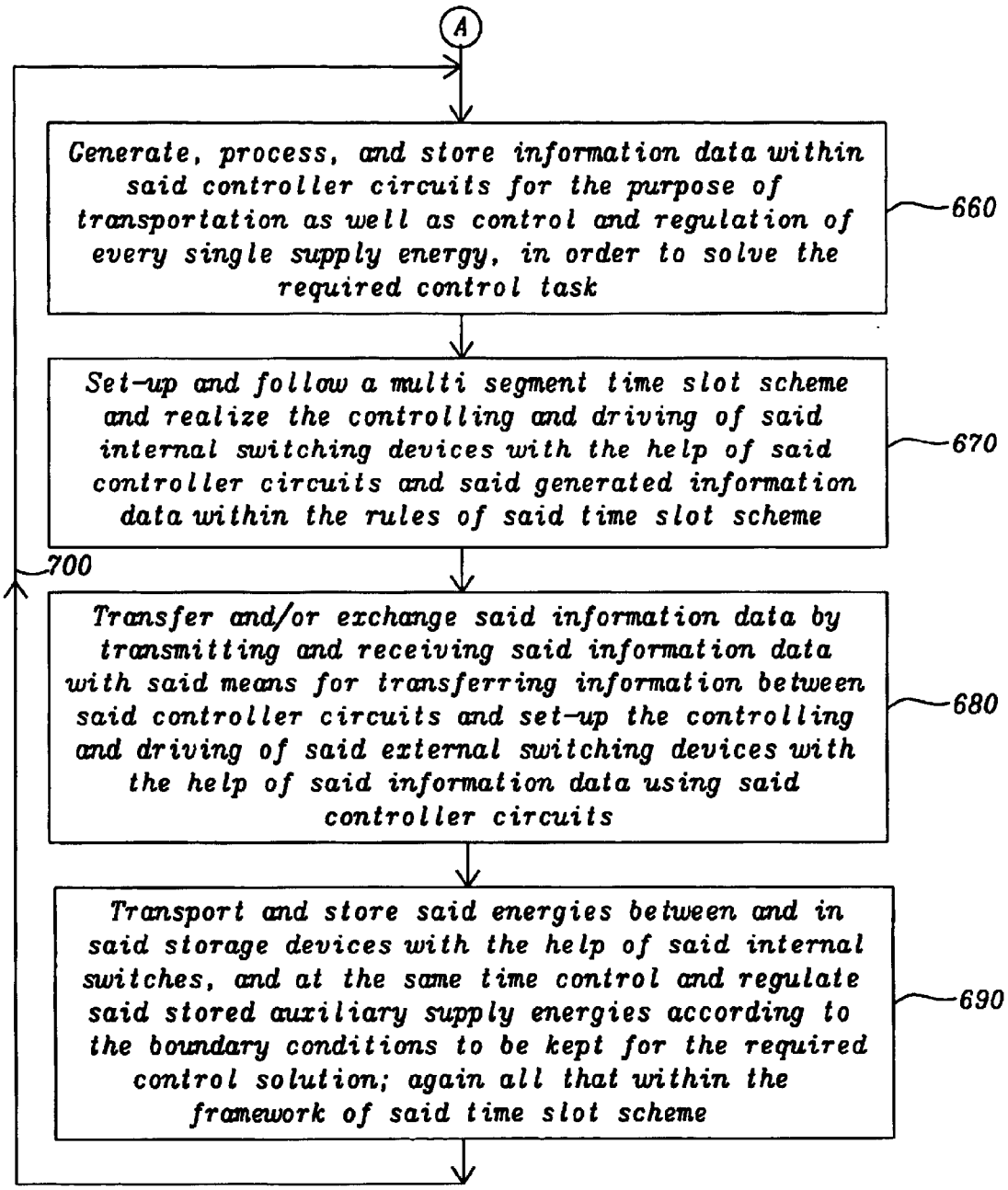
Figure 7A:
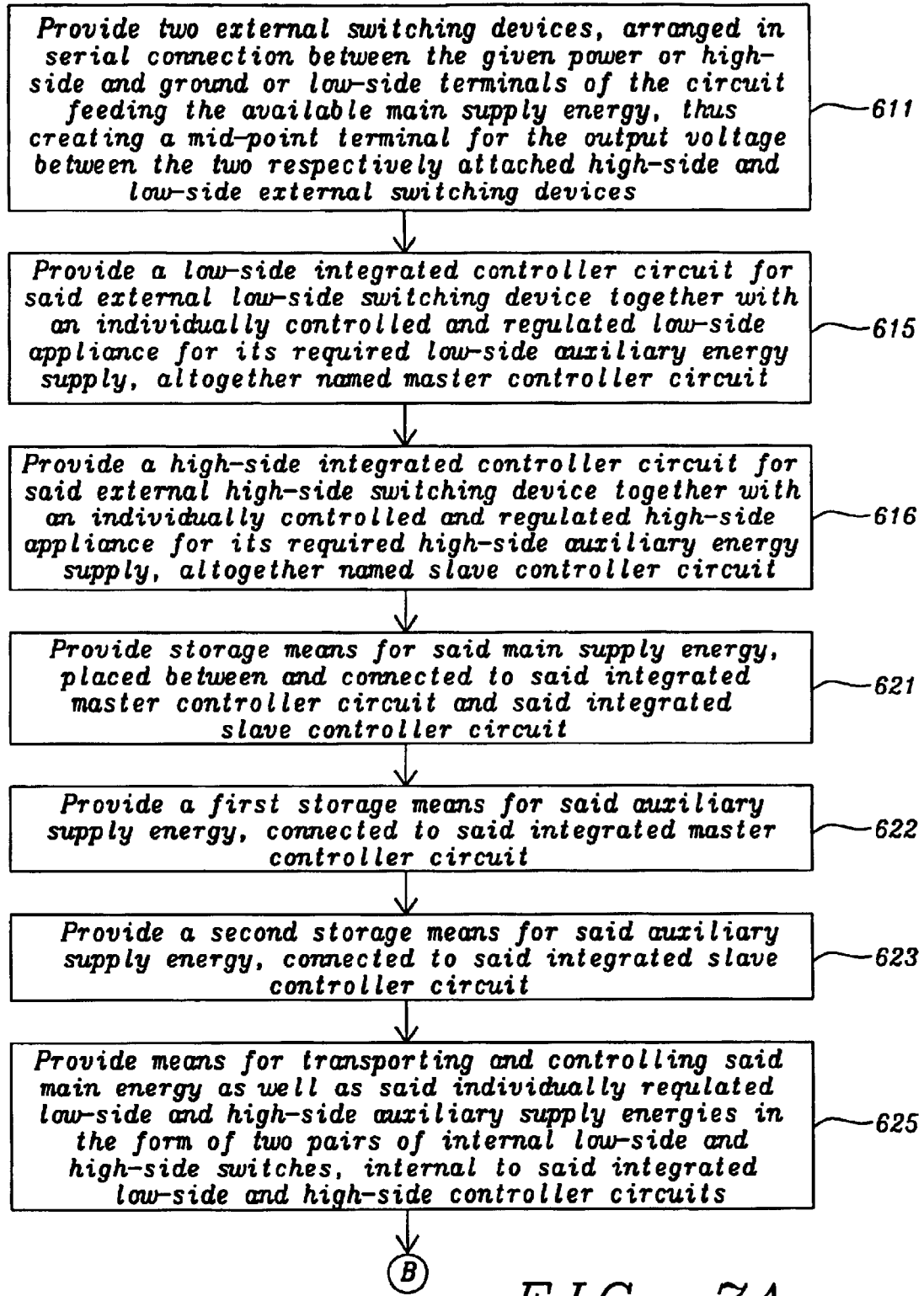
FIGS. 7A to 7E describe with a detailed flow diagram the method how to accomplish the generation and regulation of the supply and gate driving voltages for the high-side and low-side controller and driver circuits for the high-side and low-side transistors in a half-bridge realization with the circuit of the invention.
Figure 7B:
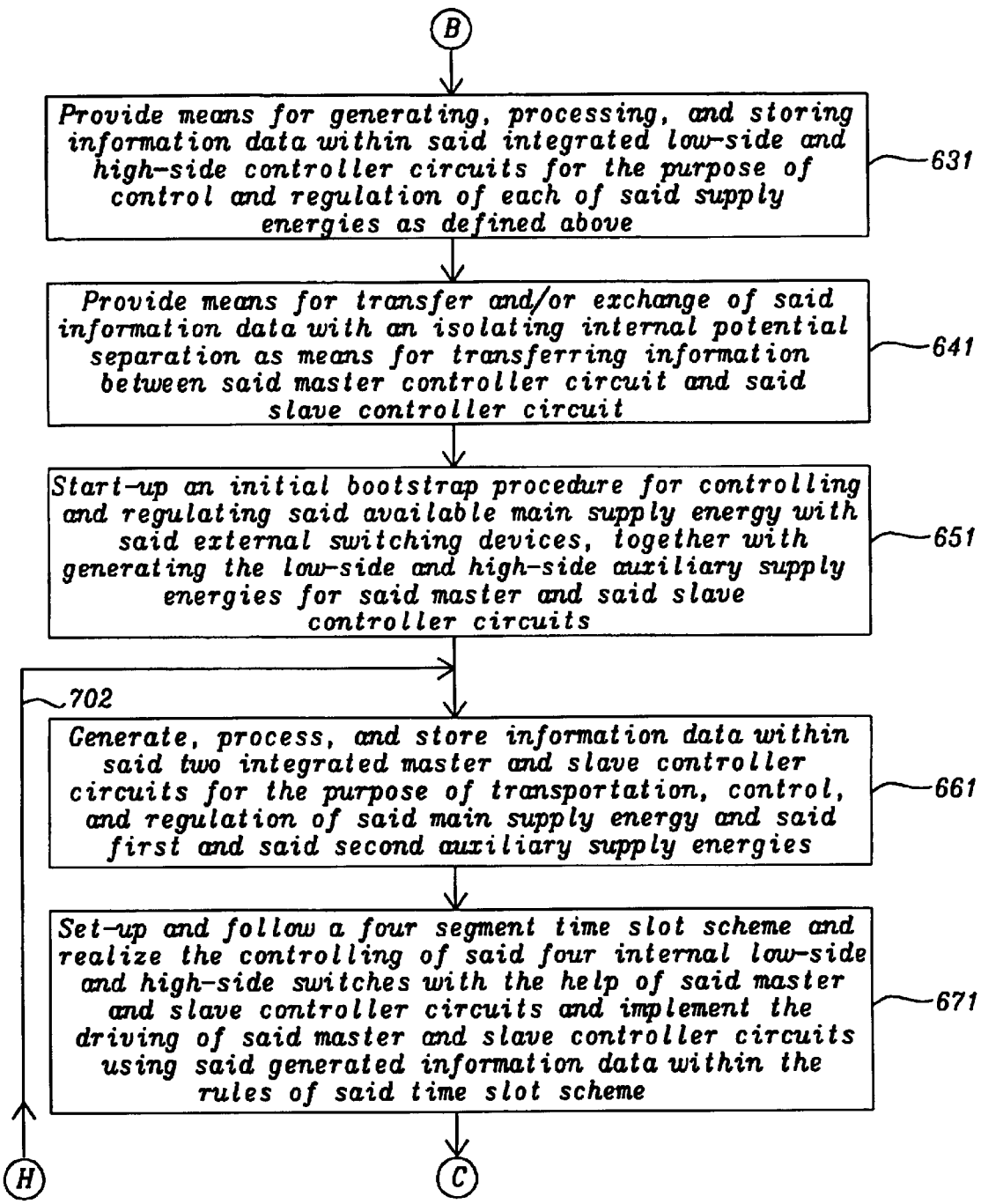
Figure 7C:
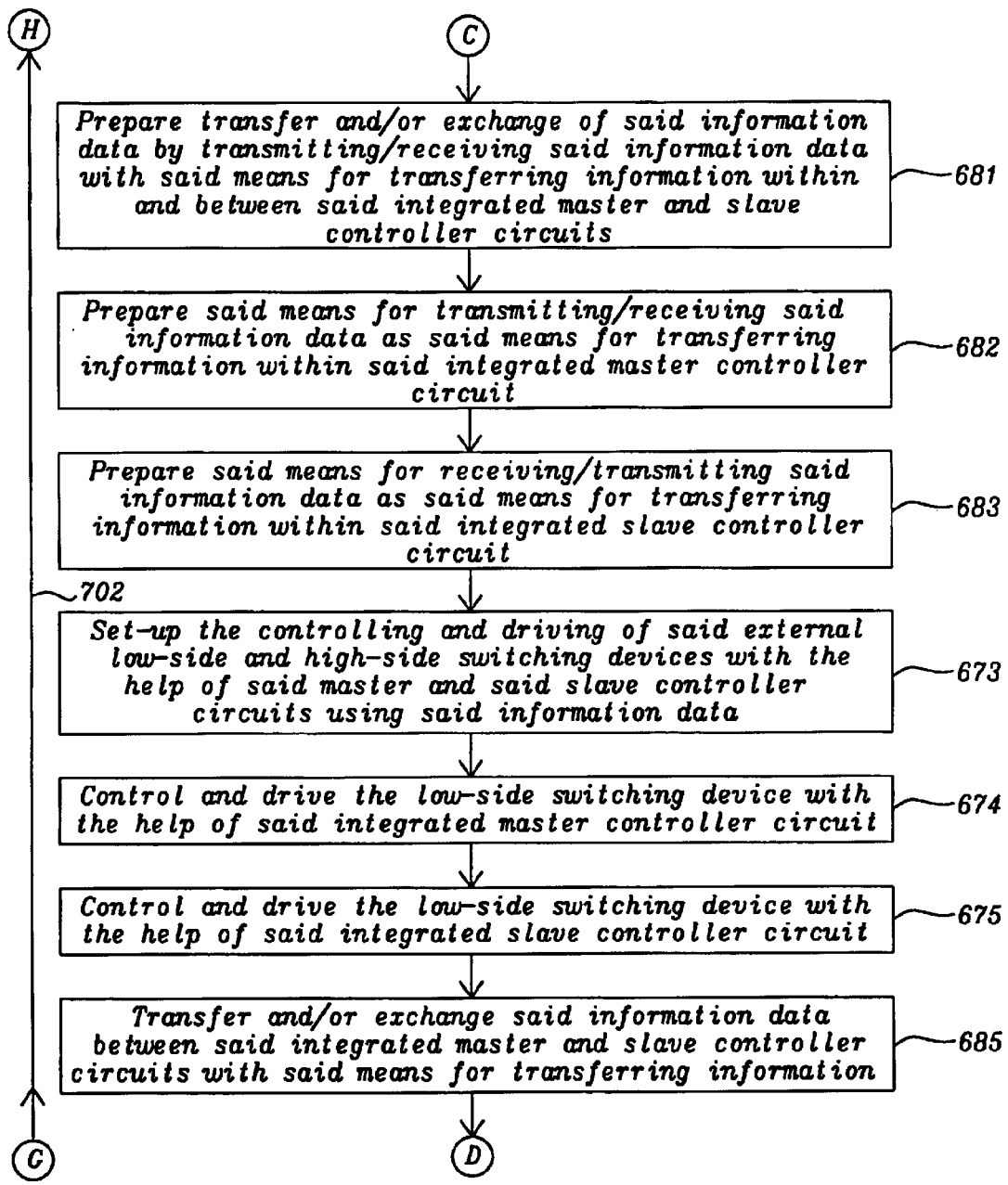
Figure 7D:
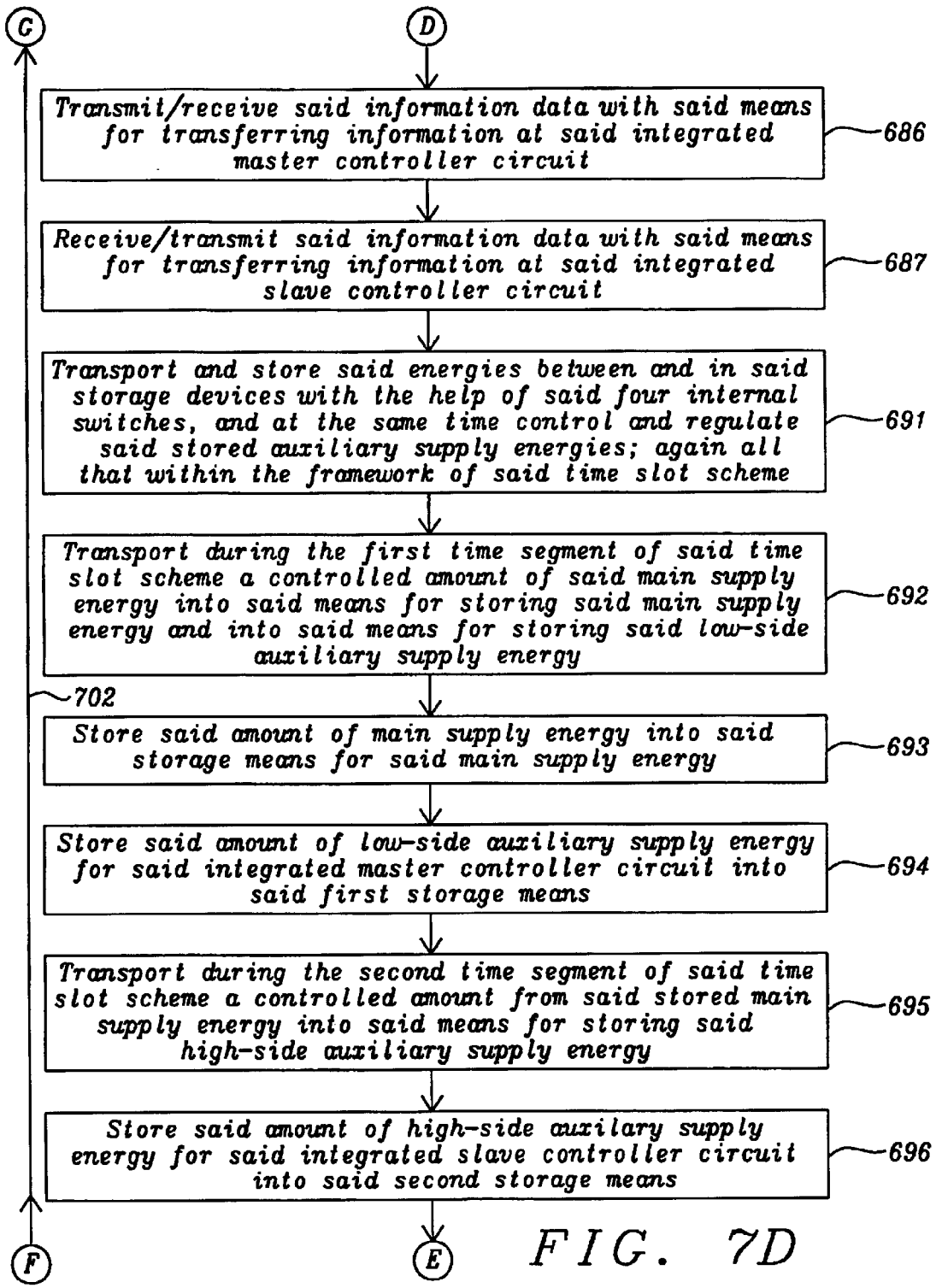
Figure 7E:
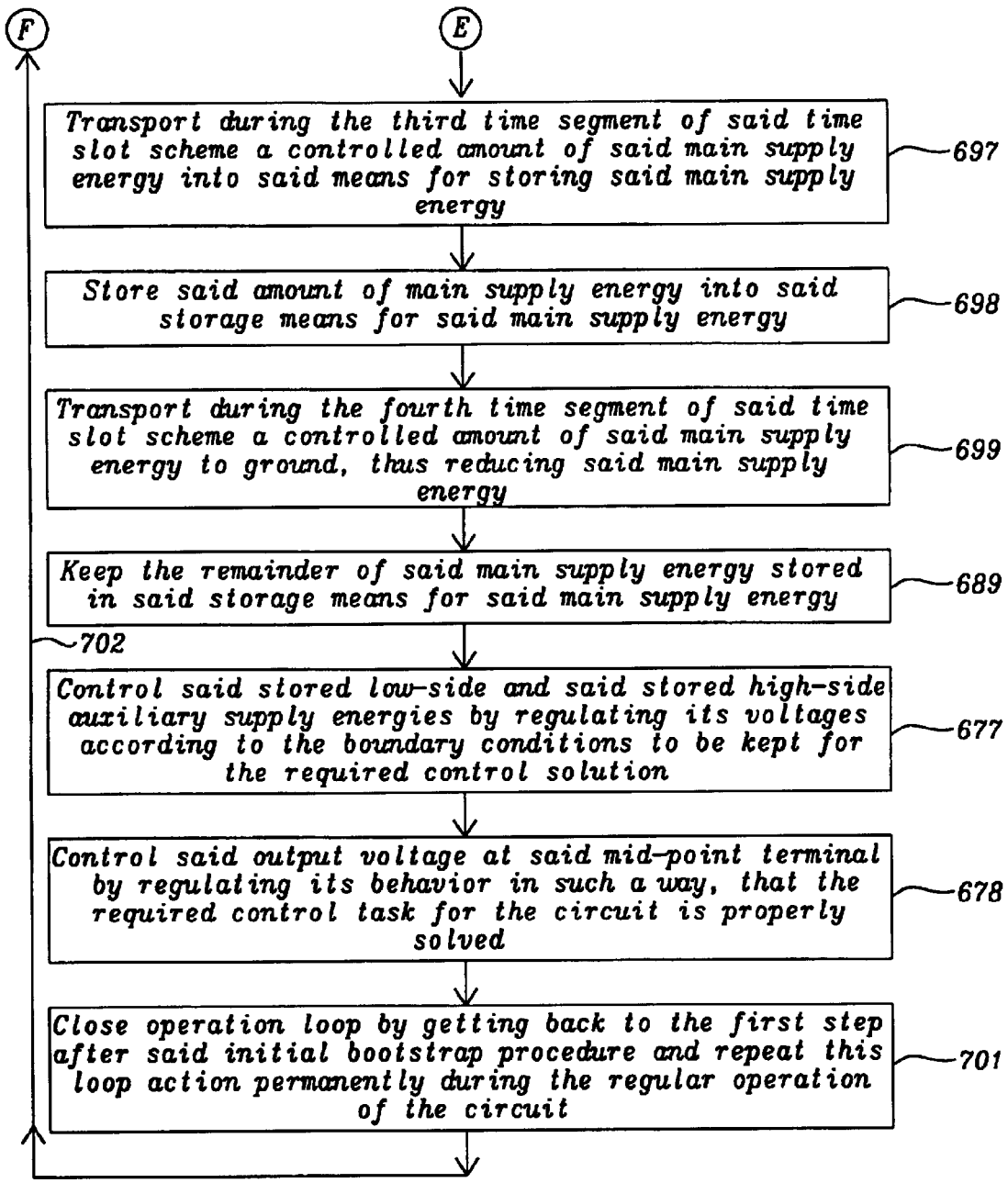

Regarding now in FIGS. 6A and 6B the flow diagram of the general method how to accomplish the generation and regulation of the supply and gate driving signals at the controller circuits for the external switching devices with a generalized circuit embodiment of the invention two parts shall be distinguished. In an introductory part, the description of all components provided is given and an initial bootstrap procedure is introduced. The main part is then explaining all the essential actions within the loop of regular operations of a circuit.

As a first step 610 in the first part is described, how to provide several external switching devices, arranged in serial connection between the given power and ground terminals of the circuit feeding the available main supply energy, and how to provide accordingly for each external switching device its own appropriate controller circuit together with its own, individually controlled and regulated appliance for the required auxiliary energy supply. Step 620 then provides separate and individual storage means for said different supply energies and provides internal switches—Internal to said controller circuits—particularly suitable for transporting, controlling and regulating said energies. Step 630 provides means for generating, processing, and storing information data within said controller circuits for the purpose of control and regulation of each supply energy as defined above. Step 640 provides means for transfer and/or exchange of said information data with a sufficiently isolating internal potential separation as means for transferring information within and between said controller circuits. Within step 650 the start-up of an initial bootstrap procedure for controlling and regulating said available main supply energy with said external switching devices, together with generating said auxiliary supply energies, as needed for regular operating said controller circuits is initiated. This concludes the first part; the second part, containing the regular operations loop of actions starts with step 660, which generates, processes, and stores information data within said controller circuits for the purpose of transportation as well as control and regulation of every single supply energy, in order to solve the required control task. At step 670 is explained, how to set-up and follow a multi segment time slot scheme and realize the controlling and driving of said internal switching devices with the help of said controller circuits and said generated information data within the rules of said time slot scheme. The transfer and/or exchange of said information data by transmitting and receiving said information data with said means for transferring information between said controller circuits and the setting-up of the controlling and the driving of said external switching devices with the help of said information data using said controller circuits is described in step 680. How to transport and store said energies between and in said storage devices with the help of said internal switches is shown in step 690 and at the same time in step 690 too, how to control and regulate said stored auxiliary supply energies according to the boundary conditions to be kept for the required control soluton; again all that within the framework of said time slot scheme. As a final step 700 the closing of the loop of operations back to step 660 is shown.

Examining now in FIGS. 7A to 7E the detailed flow chart illustrating the method how to accomplish the generation and regulation of the supply and gate driving voltage signals for the high-side and low-side controller and driver circuits for the high-side and low-side transistors in a half-bridge realization with the circuit of the invention, as extensively described and explained before, the same partition scheme of descriptive and operational parts can be recognized, albeit much more elaborate.

Starting the more descriptive part with step 611, which provides two external switching devices, arranged in serial connection between the given power or high-side and ground or low-side terminals of the circuit feeding the available main supply energy, thus creating a mid-point terminal for the output voltage between the two respectively attached high-side and low-side external switching devices and carrying on with step 615, providing a low-side integrated controller circuit for said external low-side switching device together with an individually controlled and regulated low-side appliance for its required low-side auxiliary energy supply, altogether named master controller circuit and step 616, providing a complementary high-side integrated controller circuit for said external and complementary high-side switching device together with an individually controlled and regulated high-side appliance for its required high-side auxiliary energy supply, altogether named slave controller circuit, the fundamental structure of the circuit is defined. The steps 621, 622, and 623 provide storage means for said main supply energy, placed between and connected to said integrated master controller circuit and said integrated slave controller circuit, a first storage means for said auxiliary supply energy, connected to said integrated master controller circuit, and a second storage means for said auxiliary supply energy, connected to said integrated slave controller circuit. Step 625 provides means for transporting and controlling said main energy as well as said individually regulated low-side and high-side auxiliary supply energies in the form of two pairs of internal low-side and high-side switches, internal to said integrated low-side and high-side controller circuits. With step 631 and also step 641 the data and information processing means are introduced. Step 631 provides means for generating, processing, and storing information data within said integrated low-side and high-side controller circuits for the purpose of control and regulation of each of said supply energies as defined above, and step 641 provides means for transfer and/or exchange of said information data with an isolating internal potential separation as means for transferring information between said master controller circuit and said slave controller circuit. With step 651, starting-up again an initial bootstrap procedure for controlling and regulating said available main supply energy with said external switching devices, together with generating the low-side and high-side auxiliary supply energies for said master and said slave controller circuits the descriptive part is terminated. The operational part is beginning with step 661, which generates, processes, and stores information data, within said two integrated master and slave controller circuits for the purpose of transportation, control and regulation of said main supply energy and said first and said second auxiliary supply energies, and continuing with step 671, setting-up and following a four segment time slot scheme, then realizing the controlling of said four internal low-side and high-side switches with the help of said master and slave controller circuits, and implementing the driving of said master and slave controller circuits using said generated information data within the rules of said time slot scheme. All the steps 681, 682 and 683 prepare something, transfer and/or exchange of said information data by transmitting/receiving said information data with said means for transferring information within and between said integrated master and slave controller circuits; said means for transmitting/receiving said information data as said means for transferring information within said integrated master controller circuit; said means for receiving/transmitting said information data as said means for transferring information within said integrated slave controller circuit. Step 673 describes how to set-up the controlling and driving of said external low-side and high-side switching devices with the help of said master and said slave controller circuits using said information data. Steps 674 and 675 respectively control and drive the low-side switching device with the help of said integrated master controller circuit and control and drive said high-side switching device with the help of said integrated slave controller circuit. Looking together now at steps 685, 686 and 687, it is described how to transfer and/or exchange said information data between said integrated master and slave controller circuits with said means for transferring information and how to transmit/receive said information data with said means for transferring information at said integrated master controller circuit and how to receive/transmit said information data with said means for transferring information at said integrated slave controller circuit. All the following steps, from step 691 to step 699 and also step 689 describe transportation and storage of energies in the circuit within said four segment time scheme. Step 691 transports and stores said energies between and in said storage devices with the help of said four internal switches, and at the same time control and regulate said stored auxiliary supply energies; again all that within the framework of said time slot scheme . Step 692 transports during the first time segment of said time slot scheme a controlled amount of said main supply energy into said means for storing said main supply energy and into said means for storing said low-side auxiliary supply energy. Step 693 stores said amount of main supply energy into said storage means for said main supply energy. Step 694 stores said amount of low-side auxiliary supply energy for said integrated master controller circuit into said first storage means. Step 695 transports during the second time segment of said time slot scheme a controlled amount from said stored main supply energy into said means for storing said high-side auxiliary supply energy. Step 696 stores said amount of high-side auxiliary supply energy for said integrated slave controller circuit into said second storage means. Step 697 transports during the third time segment of said time slot scheme a controlled amount of said main supply energy into said means for storing said main supply energy. Step 698 stores said amount of main supply energy into said storage means for said main supply energy. Step 699 transports during the fourth time segment of said time slot scheme a controlled amount of said main supply energy to ground, thus reducing said main supply energy. Step 689 finally keeps the remainder of said main supply energy stored in said storage means for said main supply energy. With steps 677 and 678 controlling operations are described, the control of said stored low-side and said stored high-side auxiliary supply energies by regulating its voltages according to the boundary conditions to be kept for the required control solution, and the control of said output voltage at said mid-point terminal by regulating its behavior in such a way, that the required control task for the circuit is properly solved. The final step 701 is then closing the operation loop by getting back to the first step after said initial bootstrap procedure and repeating this loop action permanently during the regular operation of the circuit. Item 702 shows this looping-back operation as an arrowed line in FIGS. 7B to 7E graphically.

As shown in the preferred embodiments, this novel circuit provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method for controlling and driving external higher voltage switching devices, such as transistors, thyristors or triacs e.g. which are configured as a half-bridge circuit branch, i.e. forming an output voltage terminal as mid-point between a high-side and a low-side switching device, both connected in series between a main supply voltage terminal, furnishing the main supply energy and a ground terminal respectively, comprising:

providing said main supply voltage terminal, said output voltage terminal, said ground terminal, said low-side switching device, said high-side switching device, an integrated low-side controller circuit, an integrated high-side controller circuit and both circuits containing four internal switches arranged as two pairs, means for transmitting/receiving said information data, means for transferring information, means for potential separation and isolation, storage means for said main supply energy, a first storage means for low-side auxiliary supply energy, a second storage means for high-side auxiliary supply energy;

arranging said external low-side switching device and said external high-side switching device in serial connection between said given power or high-side terminal and said ground or low-side terminal of the circuit, used for feeding input of said available main supply energy, thus creating said mid-point terminal for said output voltage between said two respectively attached high-side and low-side external switching devices;

associating to said external low-side switching device said integrated low-side controller circuit together with an individually controlled and regulated low-side appliance for its required low-side auxiliary energy supply as said;

associating to said external high-side switching device said integrated high-side controller circuit together with an individually controlled and regulated high-side appliance for its required high-side auxiliary energy supply as said;

assigning said main supply energy to said storage means, placed between and connected to said integrated low-side controller circuit and said integrated high-side controller circuit;

assigning said low-side auxiliary supply energy to said first storage means, connected to said integrated low-side controller circuit;

assigning said high-side auxiliary supply energy to said second storage means, connected to said integrated high-side controller circuit;

collocating for the transporting and controlling of said main energy as well as said individually regulated low-side and high-side auxiliary supply energies said two pairs of internal low-side and high-side switches, internal to said integrated low-side and high-side controller circuits;

collocating for the generating, processing, and storing said information data said integrated low-side and said integrated high-side controller circuits for the purpose of control and regulation of each of said supply energies;

collocating for the transferring and/or exchanging of said information data with said isolating internal potential separation said means for transferring information between said low-side controller circuit and said high-side controller circuit;

starting-up an initial bootstrap procedure for controlling and regulating said available main supply energy with said external switching devices; together with generating said low-side and high-side auxiliary supply energies for said low-side controller and said high-side controller circuits;

generating, processing, and storing said information data, within said two integrated low-side and high-side controller circuits for the purpose of. transportation, control and regulation of said main supply energy and said first and said second auxiliary supply energies in order to solve the required control task;

setting-up and following a four segment time slot scheme;

realizing said controlling of said four internal low-side and high-side switches with the help of said low-side and high-side controller circuits;

implementing said driving of said low-side and high-side controller circuits using said generated information data within the rules of said time slot scheme;

preparing transfer and/or exchange of said information data by transmitting/receiving said information data with said means for transferring information within and between said integrated low-side and high-side controller circuits;

preparing said means for transmitting/receiving said information data as said means for transferring information within said integrated low-side controller circuit;

preparing said means for receiving/transmitting said information data as said means for transferring information within said integrated high-side controller circuit;

setting-up the controlling and driving of said external low-side and said external high-side switching devices with the help of said low-side and said high-side controller circuits using said information data;

controlling and driving said low-side switching device with the help of said integrated low-side controller circuit;

controlling and driving said high-side switching device with the help of said integrated high-side controller circuit;

transferring and/or exchanging said information data between said integrated low-side and said integrated high-side controller circuits with said means for transferring information;

transmitting/receiving said information data with said means for transferring information at said integrated low-side controller circuit;

receiving/transmitting said information data with said means for transferring information at said integrated high-side controller circuit;

transporting and storing said energies between and in said storage devices with the help of said four internal switches; and at the same time controlling and regulating said stored auxiliary supply energies within the framework of said time slot scheme;

transporting during the first time segment of said time slot scheme a controlled amount of said main supply energy into said means for storing said main supply energy and into said means for storing said low-side auxiliary supply energy;

storing said controlled amount of said main supply energy into said storage means for said main supply energy;

storing said controlled amount of said low-side auxiliary supply energy for said integrated low-side controller circuit into said first storage means;

transporting during the second time segment of said time slot scheme a controlled amount from said stored main supply energy into said means for storing said high-side auxiliary supply energy;

storing said controlled amount of said high-side auxiliary supply energy for said integrated high-side controller circuit into said second storage means;

transporting during the third time segment of said time slot scheme a controlled amount of said main supply energy into said means for storing said main supply energy;

storing said controlled amount of main supply energy into said storage means for said main supply energy;

transporting during the fourth time segment of said time slot scheme a controlled amount of said main supply energy to ground, thus reducing said main supply energy;

keeping the remainder of said main supply energy stored in said storage means for said main supply energy; and controlling of said stored low-side and said stored high-side auxiliary supply energies by regulating its voltages according to the boundary conditions to be kept for the required control solution;

controlling of said output voltage at said mid-point terminal by regulating its behavior in such a way, that the required control task for the circuit is properly solved;

closing the operation loop by getting back to the first step after said initial bootstrap procedure; and repeating this loop action permanently during the regular operation of the circuit.

2. The method according to claim 1 wherein said low-side controller circuit is being operated as master controller and said high-side controller circuit is being operated as slave controller.

3. The method according to claim 1 wherein said low-side controller circuit is being operated as slave controller and said high-side controller circuit is being operated as master controller.

4. The method according to claim 1 wherein said main supply voltage terminal furnishing said main supply energy a direct current (DC) voltage source is connected.

5. The method according to claim 1 wherein said main supply voltage terminal furnishing said main supply energy an alternating current (AC) voltage source is connected.

6. The method according to claim 1 wherein said low-side switching device and said high-side switching device are implemented as field effect transistors.

7. The method according to claim 6 wherein said field effect transistors are manufactured in NMOS-technology.

8. The method according to claim 6 wherein said field effect transistors are manufactured in PMOS-technology.

9. The method according to claim 1 wherein said low-side switching device and said high-side switching device are implemented as thyristors.

10. The method according to claim 9 wherein said thyristors are manufactured in bipolar-technology.

11. The method according to claim 9 wherein said thyristors are manufactured in MOS-technology, e.g. as GTO-thyristors (Gate Turn Off).

12. The method according to claim 1 wherein said low-side switching device and said high-side switching device are implemented as TRIACS (TRIode Alternating Current Switch).

13. The method according to claim 1 wherein said low-side switching device and said high-side switching device are implemented as DIACS (DIode Alternating Current Switch).

14. The method according to claim 1 wherein said low-side switching device and said high-side switching device are implemented as bipolar transistors.

15. The method according to claim 1 wherein said means for potential separation and isolation is implemented as an inductive signal transformer.

16. The method according to claim 1 wherein said means for potential separation and isolation is implemented as an optoelectric coupler or optoisolator.

17. The method according to claim 1 wherein said means for potential separation and isolation is implemented using differential capacitors.

18. The method according to claim 1 wherein said means for potential separation and isolation is implemented as a coupler, exploiting Giant Magnetoresistance (GMR) materials.

19. The method according to claim 1 wherein said step of starting-up an initial bootstrap procedure is implemented using a start-up voltage signal and a resistor.

20. A method for controlling and driving several higher voltage switching devices arranged within a circuit branch in serial connection and thus forming multiple output voltage terminals as mid-points between high side and low side external switching devices, all connected in series between a main supply voltage terminal furnishing the main supply energy and a ground terminal respectively, comprising:

providing said main supply voltage terminal, said output voltage terminal, said ground terminal, more than one of said external switching devices, an integrated master controller circuit, several integrated slave controller circuits and both types of circuits containing internal switches, means for generating, processing, and storing information data, means for transmitting/receiving said information data, means for transferring information; means for potential separation and isolation, storage means for said main supply energy, and several storage means for auxiliary supply energies;

arranging said several external switching devices in serial connection between said power terminal of the circuit, feeding input for the available main supply energy and said ground terminal;

associating to each of said external switching device its own appropriate controller circuit together with its own, individually controlled and regulated appliance for the required auxiliary energy supply;

assigning for said main supply energy and said different supply energies said separate and individual storage means;

transporting, controlling and regulating said energies with the help of said internal switches in said integrated master controller circuit and in said several integrated slave controller circuits;

generating, processing, and storing information data within said controller circuits for the purpose of control and regulation of each supply energy;

transferring and/or exchanging of said information data with a sufficiently isolating internal potential separation as means for transferring information within and between said controller circuits;

starting-up an initial bootstrap procedure for controlling and regulating said available main supply energy with said external switching devices together with generating said auxiliary supply energies, as needed for regular operation of said controller circuits;

generating, processing, and storing said information data within said controller circuits for the purpose of transportation as well as control and regulation of said every single supply energy, in order to solve the required control task;

setting-up and following a multi segment time slot scheme;

controlling and driving of said internal switching devices with the help of said controller circuits and said generated information data within the rules of said time slot scheme; and transferring and/or exchanging of said information data by transmitting and receiving said information data with said means for transferring information between said controller circuits;

setting-up of the controlling and the driving of said external switching devices with the help of said information data using said controller circuits;

transporting and storing said energies between and in said storage devices with the help of said internal switches;

controlling and regulating said stored auxiliary supply energies according to the boundary conditions to be kept for the required control solution;

synchronizing all that within the framework of said time slot scheme; and at the same time operating regularly in a closed loop of operations.

21. The method according to claim 20 wherein said integrated master controller circuit is located at the lowest possible position within said ladder structure i.e. closest to said ground terminal.

22. The method according to claim 20 wherein to said main supply voltage terminal furnishing said main supply energy a direct current (DC) voltage source is connected.

23. The method according to claim 20 wherein to said main supply voltage terminal furnishing said main supply energy an alternating current (AC) voltage source is connected.

24. The method according to claim 20 wherein said low-side switching device and said high-side switching device are implemented as field effect transistors.

25. The method according to claim 24 wherein said field effect transistors are manufactured in NMOS-technology.

26. The method according to claim 24 wherein said field effect transistors are manufactured in PMOS-technology.

27. The method according to claim 20 wherein said low-side switching device and said high-side switching device are implemented as thyristors.

28. The method according to claim 27 wherein said thyristors are manufactured in bipolar-technology.

29. The method according to claim 27 wherein said thyristors are manufactured in MOS-technology, e.g. as GTO-thyristors (Gate Turn Off).

30. The method according to claim 20 wherein said low-side switching device and said high-side switching device are implemented as TRIACS (TRIode Alternating Current Switch).

31. The method according to claim 20 wherein said low-side switching device and said high-side switching device are implemented as DIACS (DIode Alternating Current Switch).

32. The method according to claim 20 wherein said low-side switching device and said high-side switching device are implemented as bipolar transistors.

33. The method according to claim 20 wherein said means for potential separation and isolation is implemented as an inductive signal transformer.

34. The method according to claim 20 wherein said means for potential separation and isolation is implemented as an optoelectric coupler or optoisolator.

35. The method according to claim 20 wherein said means for potential separation and isolation is implemented using differential capacitors.

36. The method according to claim 20 wherein said means for potential separation and isolation is implemented as a coupler, exploiting Giant Magnetoresistance (GMR) materials.

37. The method according to claim 20 wherein said step of starting-up an initial bootstrap procedure is implemented using a start-up voltage signal and a resistor.

38. A circuit, capable of controlling and driving higher voltage switching devices, such as transistors, thyristors or triacs, which are configured as a half-bridge circuit branch, i.e. forming an output voltage terminal as mid-point between a high-side and a low-side switching device, both connected in series between a main supply voltage terminal—furnishing the main supply energy—and a ground terminal, further including low-side and high-side controller circuits having external terminals for signals and supply or start-up voltages and currents as well as a terminal for control data input and output, comprising:

means for controlling and driving said low-side switching device, designated as integrated low-side controller circuit;

means for controlling and driving said high-side switching device, designated as integrated high-side controller circuit;

means for generating, storing, and processing information data, within said integrated low-side controller circuit and said integrated high-side controller circuit;

means for transmitting and/or receiving information data, within said integrated low-side controller circuit and said integrated high-side controller circuit;

means for transferring information data, between said integrated low-side controller circuit and said integrated high-side controller circuit;

means for potential separation and isolation of said means for transferring information between said integrated low-side controller circuit and said integrated high-side controller circuit;

means for storing said main supply energy, placed between and connected to said integrated low-side controller circuit and said integrated high-side controller circuit;

means for storing the low-side auxiliary supply energy for said integrated low-side controller circuit;

means for storing the high-side auxiliary supply energy for said integrated high-side controller circuit;

means for transporting said main supply energy into said means for storing said low-side auxiliary supply energy;

means for transporting said main supply energy into said means for storing said high-side auxiliary supply energy;

means for generating, controlling and regulating said low-side and said high-side auxiliary supply energies;

means for starting-up the operation of said means for generating, controlling and regulating said low-side and said high-side auxiliary supply energies during an initial bootstrapping procedure; and means for generating and controlling said low-side and said high-side output signals driving said switching devices.

39. The circuit according to claim 38 wherein said integrated low-side controller circuit is being operated as master controller and said integrated high-side controller circuit is being operated as slave controller.

40. The circuit according to claim 38 wherein said integrated low-side controller circuit is being operated as slave controller and said integrated high-side controller circuit is being operated as master controller.

41. The circuit according to claim 38 wherein said main supply voltage terminal furnishing said main supply energy a direct current (DC) voltage source is connected.

42. The circuit according to claim 38 wherein said main supply voltage terminal furnishing said main supply energy an alternating current (AC) voltage source is connected.

43. The circuit according to claim 38 wherein said low-side switching device and said high-side switching device are implemented as field effect transistors.

44. The circuit according to claim 43 wherein said field effect transistors are manufactured in NMOS-echnology.

45. The circuit according to claim 43 wherein said field effect transistors are manufactured in PMOS-technology.

46. The circuit according to claim 38 wherein said low-side switching device and said high-side switching device are implemented as thyristors.

47. The circuit according to claim 46 wherein said thyristors are manufactured in bipolar-technology.

48. The circuit according to claim 46 wherein said thyristors are manufactured in MOS-technology, e.g. as GTO-thyristors (Gate Turn Off).

49. The circuit according to claim 38 wherein said low-side switching device and said high-side switching device are implemented as TRIACS (TRIode Alternating Current Switch).

50. The circuit according to claim 38 wherein said low-side switching device and said high-side switching device are implemented as DIACS (DIode Alternating Current Switch).

51. The circuit according to claim 38 wherein said low-side switching device and said high-side switching device are implemented as bipolar transistors.

52. The circuit according to claim 38 wherein said means for potential separation and isolation is located internal to said integrated master controller circuit.

53. The circuit according to claim 38 wherein said means for potential separation and isolation is located internal to said integrated slave controller circuit.

54. The circuit according to claim 38 wherein said means for potential separation and isolation is located between said integrated master control circuit and said integrated slave controller circuit.

55. The circuit according to claim 38 wherein said means for potential separation and isolation is implemented as an inductive signal transformer.

56. The circuit according to claim 38 wherein said means for potential separation and isolation is implemented as an optoelectric coupler or optoisolator.

57. The circuit according to claim 38 wherein said means for potential separation and isolation is implemented using differential capacitors.

58. The circuit according to claim 38 wherein said means for potential separation and isolation is implemented as a coupler, exploiting Giant Magnetoresistance (GMR) materials.

59. The circuit according to claim 38 wherein said means for storing said main supply energy is implemented as a serial circuit of a generic resistive element with an energy storing capacitor.

60. The circuit according to claim 59 wherein said generic resistive element is specifically realized as a simple straight wire.

61. The circuit according to claim 59 wherein said generic resistive element is specifically realized as a resistor.

62. The circuit according to claim 59 wherein said generic resistive element is specifically realized as an inductor.

63. The circuit according to claim 38 wherein said means for storing the low-side auxiliary supply energy is realized with an energy storing capacitor.

64. The circuit according to claim 38 wherein said means for storing the high-side auxiliary supply energy is realized with an energy storing capacitor.

65. The circuit according to claim 38 wherein said means for storing the low-side auxiliary supply energy is realized with an energy storing capacitor.

66. The circuit according to claim 38 wherein said means for transporting said main supply energy into said means for storing said low-side auxiliary supply energy is implemented with integrated semiconductor switching devices.

67. The circuit according to claim 38 wherein said means for transporting said main supply energy into said means for storing said high-side auxiliary supply energy is implemented with integrated semiconductor switching devices.

68. The circuit according to claim 38 wherein said means for starting-up the operation during an initial bootstrap procedure is implemented using a start-up voltage signal and a resistor.

69. A circuit, capable of controlling and driving several higher voltage switching devices, such as transistors, thyristors or triacs, which are configured as a serial connection of low side and high side switching devices, implementing a structure of switches comparable to the steps of a ladder, i.e. forming multiple output voltage terminals as mid-points between every two consecutive switching devices, all together connected in series between a main supply voltage terminal—furnishing the main supply energy—and a ground terminal, further including a master and several slave controller circuits having external terminals for signals and supply or start-up voltages and currents as well as terminals for control data input and output, comprising:

means for controlling and driving a first switching device, designated as integrated master controller circuit;

means for controlling and driving said switching devices other than said first switching device, designated as integrated slave controller circuits;

means for generating, storing, and processing information data, within said integrated master controller circuit and said integrated slave controller circuits;

means for transmitting and/or receiving information data, within said integrated master controller circuit and said integrated slave controller circuits;

means for transferring information data, between said integrated master controller circuit and said integrated slave controller circuits;

means for potential separation and isolation of said means for transferring information between said integrated master controller circuit and said integrated slave controller circuits;

means for storing said main supply energy, placed between and connected to said integrated master controller circuit and/or said integrated slave controller circuits;

means for storing the auxiliary supply energy for said integrated master controller circuit;

means for storing the auxiliary supply energies for said integrated slave controller circuits;

means for transporting said main supply energy into said means for storing said auxiliary supply energy for said integrated master controller circuit;

means for transporting said main supply energy into said means for storing said auxiliary supply energies for said integrated slave controller circuits;

means for generating, controlling and regulating said auxiliary supply energies;

means for starting-up the operation of said means for generating, controlling and regulating said auxiliary supply energies during an initial bootstrapping procedure; and means for generating and controlling said output signals driving said several switching devices.

70. The circuit according to claim 69 wherein said integrated master controller circuit is located at the lowest possible position within said ladder structure i.e. closest to said ground terminal.

71. The circuit according to claim 69 wherein said main supply voltage terminal furnishing said main supply energy a direct current (DC) voltage source is connected.

72. The circuit according to claim 69 wherein said main supply voltage terminal furnishing said main supply energy an alternating current (AC) voltage source is connected.

73. The circuit according to claim 69 wherein said low-side switching device and said high-side switching device are implemented as field effect transistors.

74. The circuit according to claim 73 wherein said field effect transistors are manufactured in NMOS-technology.

75. The circuit according to claim 73 wherein said field effect transistors are manufactured in PMOS-technology.

76. The circuit according to claim 69 wherein said low-side switching device and said high-side switching device are implemented as thyristors.

77. The circuit according to claim 76 wherein said thyristors are manufactured in bipolar-technology.

78. The circuit according to claim 76 wherein said thyristors are manufactured in MOS-technology, e.g. as GTO-thyristors (Gate Turn Off).

79. The circuit according to claim 69 wherein said low-side switching device and said high-side switching device are implemented as TRIACS (TRIode Alternating Current Switch).

80. The circuit according to claim 69 wherein said low-side switching device and said high-side switching device are implemented as DIACS (DIode Alternating Current Switch).

81. The circuit according to claim 69 wherein said low-side switching device and said high-side switching device are implemented as bipolar transistors.

82. The circuit according to claim 69 wherein said means for potential separation and isolation is located internal to said integrated master controller circuit.

83. The circuit according to claim 69 wherein said means for potential separation and isolation is located internal to said integrated slave controller circuit.

84. The circuit according to claim 69 wherein said means for potential separation and isolation is located between said integrated master control circuit and said integrated slave controller circuit.

85. The circuit according to claim 69 wherein said means for potential separation and isolation is implemented as an inductive signal transformer.

86. The circuit according to claim 69 wherein said means for potential separation and isolation is implemented as an optoelectric coupler or optoisolator.

87. The circuit according to claim 69 wherein said means for potential separation and isolation is implemented using differential capacitors.

88. The circuit according to claim 69 wherein said means for potential separation and isolation is implemented as a coupler, exploiting Giant Magnetoresistance (GMR) materials.

89. The circuit according to claim 69 wherein said means for storing said main supply energy is implemented as a serial circuit of a generic resistive element with an energy storing capacitor.

90. The circuit according to claim 89 wherein said generic resistive element is specifically realized as a simple straight wire.

91. The circuit according to claim 89 wherein said generic resistive element is specifically realized as a resistor.

92. The circuit according to claim 89 wherein said generic resistive element is specifically realized as an inductor.

93. The circuit according to claim 69 wherein said means for storing the low-side auxiliary supply energy is realized with an energy storing capacitor.

94. The circuit according to claim 69 wherein said means for storing the high-side auxiliary supply energy is realized with an energy storing capacitor.

95. The circuit according to claim 69 wherein said means for storing the low-side auxiliary supply energy is realized with an energy storing capacitor.

96. The circuit according to claim 69 wherein said means for transporting said main supply energy into said means for storing said low-side auxiliary supply energy is implemented with integrated semiconductor switching devices.

97. The circuit according to claim 69 wherein said means for transporting said main supply energy into said means for storing said high-side auxiliary supply energy is implemented with integrated semiconductor switching devices.

98. The circuit according to claim 69 wherein said means for starting-up the operation during an initial bootstrap procedure is implemented using a start-up voltage signal and a resistor.

99. A circuit, capable of controlling and driving higher voltage switching devices, such as transistors, thyristors or triacs, which are configured as a half-bridge circuit branch, i.e. forming an output voltage terminal as mid-point between a high-side and a low-side switching device, both connected in series between a main supply voltage terminal—furnishing the main supply energy—and a ground terminal, further including integrated low-side and high-side controller circuits having external terminals for signals and supply or start-up voltages and currents as well as a terminal for control data input and output, comprising:

said low-side switching device, one contact connected to said ground terminal and the other contact connected to said output voltage terminal and mid-point of said half-bridge;

said high-side switching device, one contact connected to said output voltage terminal and mid-point of said half-bridge and the other contact connected to said main supply voltage terminal;

said integrated low-side controller circuit for generating, storing, and processing information data as well as for controlling and driving said low-side switching device having an output signal terminal connected to the control input of said low-side switching device, further having two signal terminals for transmitting and/or receiving information data, having two terminals for said supply and start-up voltage, and having a terminal for said supply current;

said integrated high-side controller circuit for generating, storing, and processing information data as well as for controlling and driving said high-side switching device having an output signal terminal connected to the control input of said high-side switching device, further having two signal terminals for transmitting and/or receiving information data, having two terminals for said supply and start-up voltage, and having a terminal for said supply current;

a first capacitor for storing the low-side auxiliary supply energy for said integrated low-side controller circuit and connected with one point to said supply voltage terminal of said controller circuit and connected with the other point to said ground terminal;

a second capacitor for storing the high-side auxiliary supply energy for said integrated high-side controller circuit and connected with one point to said supply voltage terminal of said controller circuit and connected with the other point to said output voltage terminal at said mid-point of said half-bridge;

a combination of a capacitor—for storing the main supply energy—serially connected to a general resistive element, thus forming a two-pole circuit, placed between said integrated low-side controller circuit and said integrated high-side controller circuit and connected each with one of its two poles to said terminals for said supply current at each of said integrated controller circuits;

a two-wire connection between said integrated low-side controller circuit and said integrated high-side controller circuit for transferring information data between said controller circuits and each side of the wires connected to said signal terminals at each of said controller circuits;

a coupling element or four-pole circuit as device for potential separation and isolation of said two-wire connection between said integrated low-side controller circuit and said integrated high-side controller and connected to each of said signal terminals at each of said controller circuits;

a first pair of internal switching devices—internal to said integrated low-side controller circuit and conjointly connected each with one contact to said terminal for said supply current—for transporting said main supply energy into said first capacitor for storing said low-side auxiliary supply energy, having the other contacts of said switching devices connected to said supply voltage terminal of said controller circuit and to said ground terminal respectively;

a second pair of internal switching devices—internal to said integrated high-side controller circuit and conjointly connected each with one contact to said terminal for said supply current—for transporting said main supply energy into said second capacitor for storing said high-side auxiliary supply energy, having the other contacts of said switching devices connected to said supply voltage terminal of said controller circuit and to said output voltage terminal at said mid-point of said half-bridge respectively;

internal circuit blocks within each of said integrated controller circuits for data processing, data storage and data driving for generating, controlling and regulating said low-side and said high-side auxiliary supply energies appropriately connected to each other and to said internal switching devices, having also connections to said signal and control terminals as well as to said supply voltage terminals, to said ground terminals or said output voltage terminals of said controller circuits;

two resistors for starting-up the operation of said internal circuit blocks for generating, controlling and regulating said low-side and said high-side auxiliary supply energies during an initial bootstrapping procedure and connected each with one point to an external start-up DC-voltage and each with its other point to said supply voltage terminals of each of said controller circuits; and internal circuit blocks within each of said integrated controller circuits for data processing, data storage and data driving for generating and controlling said low-side and said high-side output signals driving said output terminals of said integrated controller circuits appropriately connected to each other and to said internal switching devices, having also connections to said signal and control terminals as well as to said supply voltage terminals, to said ground terminals or said output voltage terminals of said controller circuits.

100. The circuit according to claim 99 wherein said main supply voltage terminal furnishing said main supply energy a direct current (DC) voltage source is connected.

101. The circuit according to claim 99 wherein said main supply voltage terminal furnishing said main supply energy an alternating current (AC) voltage source is connected.

102. The circuit according to claim 99 wherein said integrated low-side controller circuit is being operated as master controller and said integrated high-side controller circuit is being operated as slave controller.

103. The circuit according to claim 99 wherein said integrated low-side controller circuit is being operated as slave controller and said integrated high-side controller circuit is being operated as master controller.

104. The circuit according to claim 102 wherein said master controller has a terminal for said control data input and output.

105. The circuit according to claim 103 wherein said master controller has a terminal for said control data input and output.

106. The circuit according to claim 99 wherein said low-side switching device and said high-side switching device are implemented as field effect transistors.

107. The circuit according to claim 106 wherein said field effect transistors are manufactured in NMOS-technology.

108. The circuit according to claim 106 wherein said field effect transistors are manufactured in PMOS-technology.

109. The circuit according to claim 99 wherein said low-side switching device and said high-side switching device are implemented as thyristors.

110. The circuit according to claim 109 wherein said thyristors are manufactured in bipolar-technology.

111. The circuit according to claim 109 wherein said thyristors are manufactured in MOS-technology, e.g. as GTO-thyristors (Gate Turn Off).

112. The circuit according to claim 99 wherein said low-side switching device and said high-side switching device are implemented as TRIACS (TRIode Alternating Current Switch).

113. The circuit according to claim 99 wherein said low-side switching device and said high-side switching device are implemented as DIACS (DIode Alternating Current Switch).

114. The circuit according to claim 99 wherein said low-side switching device and said high-side switching device are implemented as bipolar transistors.

115. The circuit according to claim 99 wherein said coupling element or four-pole circuit for potential separation and isolation is located internal to said integrated master controller circuit.

116. The circuit according to claim 99 wherein said coupling element or four-pole circuit for potential separation and isolation is located internal to said integrated slave controller circuit.

117. The circuit according to claim 99 wherein said coupling element or four-pole circuit for potential separation and isolation is located between said integrated master control circuit and said integrated slave controller circuit.

118. The circuit according to claim 99 wherein said coupling element or four-pole circuit for potential separation and isolation is implemented as an inductive signal transformer.

119. The circuit according to claim 99 wherein said coupling element or four-pole circuit for potential separation and isolation is implemented as an optoelectric coupler or optoisolator.

120. The circuit according to claim 99 wherein said coupling element or four-pole circuit for potential separation and isolation is implemented using differential capacitors.

121. The circuit according to claim 99 wherein said coupling element or four-pole circuit for potential separation and isolation is implemented as a coupler, exploiting Giant Magnetoresistance (GMR) materials.

122. The circuit according to claim 99 wherein said combination of said capacitor for storing said main supply energy is implemented as a serial circuit of a generic resistive element with an energy storing capacitor.

123. The circuit according to claim 122 wherein said generic resistive element is specifically realized as a simple straight wire.

124. The circuit according to claim 122 wherein said generic resistive element is specifically realized as a resistor.

125. The circuit according to claim 122 wherein said generic resistive element is specifically realized as an inductor.

126. The circuit according to claim 99 wherein said first pair of internal switching devices is implemented with integrated semiconductor switching devices.

127. The circuit according to claim 99 wherein said second pair of internal switching devices is implemented with integrated semiconductor switching devices.

128. The circuit according to claim 99 manufactured in monolithic integrated circuit technology.

129. The circuit according to claim 99 manufactured in monolithic integrated CMOS technology.

130. The circuit according to claim 99 manufactured in monolithic integrated CMOS circuit technology with additional discrete PMOS and/or NMOS transistors.

131. The circuit according to claim 99 manufactured in monolithic integrated CMOS circuit technology with additional discrete PMOS and/or NMOS transistors with extended drain technology.

132. The circuit according to claim 99 manufactured in monolithic integrated CMOS technology with additional PMOS and/or NMOS transistors with extended drain technology, assembled in Chip-On-Chip technology.

* * * * *